United States Patent
Huang et al.

(10) Patent No.: US 12,408,465 B2
(45) Date of Patent: Sep. 2, 2025

(54) CIRCUIT BOARD ASSEMBLY, PHOTOSENSITIVE ASSEMBLY, CAMERA MODULE, AND PREPARATION METHODS FOR CIRCUIT BOARD ASSEMBLY AND PHOTOSENSITIVE ASSEMBLY

(71) Applicant: NINGBO SUNNY OPOTECH CO., LTD., Zhejiang (CN)

(72) Inventors: Zhen Huang, Zhejiang (CN); Zhongyu Luan, Zhejiang (CN); Yinbo Zhang, Zhejiang (CN); Fengsheng Xi, Zhejiang (CN); Hongfeng Gan, Zhejiang (CN)

(73) Assignee: NINGBO SUNNY OPOTECH CO., LTD., Zhejiang (CN)

( * ) Notice: Subject to any disclaimer, the term of this patent is extended or adjusted under 35 U.S.C. 154(b) by 456 days.

(21) Appl. No.: 17/770,744

(22) PCT Filed: Oct. 21, 2020

(86) PCT No.: PCT/CN2020/122405
§ 371 (c)(1),
(2) Date: Apr. 21, 2022

(87) PCT Pub. No.: WO2021/078138
PCT Pub. Date: Apr. 29, 2021

(65) Prior Publication Data
US 2022/0367556 A1   Nov. 17, 2022

(30) Foreign Application Priority Data

Oct. 21, 2019   (CN) .......................... 201910999211.3
Oct. 21, 2019   (CN) .......................... 201910999377.5

(51) Int. Cl.
*H01L 27/146* (2006.01)
*H10F 39/00* (2025.01)

(52) U.S. Cl.
CPC ......... *H10F 39/811* (2025.01); *H10F 39/804* (2025.01); *H10F 39/8057* (2025.01); *H10F 39/806* (2025.01)

(58) Field of Classification Search
None
See application file for complete search history.

(56) References Cited

U.S. PATENT DOCUMENTS

2004/0089906 A1   5/2004   Hsin
2007/0126899 A1   6/2007   Kim
(Continued)

FOREIGN PATENT DOCUMENTS

CN   101582435   11/2009
CN   102331612   1/2012
(Continued)

OTHER PUBLICATIONS

International Search Report issued Jan. 20, 2021 in corresponding International Application No. PCT/CN2020/122405.

*Primary Examiner* — Asok K Sarkar
(74) *Attorney, Agent, or Firm* — Wenderoth, Lind & Ponack, L.L.P.

(57) ABSTRACT

The present application relates to a circuit board assembly, a photosensitive assembly, a camera module, and preparation methods for the circuit board assembly and the photosensitive assembly. The photosensitive assembly includes a circuit board and a photosensitive chip. The circuit board includes a circuit board main body, a through hole formed through the circuit board main body, a set of circuit board electrical connecting terminals disposed on the lower surface of the circuit board main body, a conducting medium disposed on the circuit board electrical connecting terminals, and a non-conducting adhesive covering the conducting medium. The photosensitive chip includes chip electrical connecting terminals disposed in a non-photosensitive area.

(Continued)

The chip electrical connecting terminals of the photosensitive chip is in contact with the conducting medium to be electrically connected to the circuit board electrical connecting terminals, and the photosensitive chip is bonded to the lower surface of the circuit board via the non-conducting adhesive, so that the photosensitive chip is electrically connected to the circuit board. In this way, the photosensitive chip is stably electrically connected to the circuit board with relatively low costs and relatively low process difficulty.

18 Claims, 24 Drawing Sheets

(56) References Cited

U.S. PATENT DOCUMENTS

| | | |
|---|---|---|
| 2009/0284628 A1 | 11/2009 | Wu et al. |
| 2014/0049684 A1 | 2/2014 | Cheng et al. |
| 2019/0043904 A1* | 2/2019 | Chien ............... H01L 27/14618 |

FOREIGN PATENT DOCUMENTS

| | | |
|---|---|---|
| CN | 103633033 | 3/2014 |
| CN | 204928997 | 12/2015 |
| CN | 106817518 | 6/2017 |
| CN | 206894759 | 1/2018 |
| CN | 108391366 | 8/2018 |
| JP | 2001-332846 | 11/2001 |
| KR | 10-2006-0019680 | 3/2006 |

* cited by examiner

CIRCUIT BOARD ASSEMBLY, PHOTOSENSITIVE ASSEMBLY, CAMERA MODULE, AND PREPARATION METHODS FOR CIRCUIT BOARD ASSEMBLY AND PHOTOSENSITIVE ASSEMBLY

TECHNICAL FIELD

The present application relates to field of camera module, in particular to a circuit board assembly, a photosensitive assembly, a camera module, and preparation methods for the circuit board assembly and photosensitive assembly.

BACKGROUND ART

With the popularization of mobile electronic devices, the related technologies of camera modules used in mobile electronic devices to help users obtain images (such as videos or images) have been rapidly developed and advanced, and in recent years, camera modules has been widely used in many fields such as medical treatment, security, industrial production and so on.

In order to meet more and more extensive market demands, high pixel, large chip, small size, and large aperture are the irreversible development trends of existing camera modules. However, it is very difficult to realize the four requirements of high pixel, large chip, small size and large aperture in a same camera molding.

Firstly, the market has put forward higher and higher requirements for the imaging quality of camera modules. How to obtain higher imaging quality with a smaller camera module volume has become a big challenge for compact camera module (such as a camera module for mobile phones), especially under the premise of the development trend of high pixel, large aperture, large chip and other technologies in the mobile phone industry.

Secondly, the compact development of mobile phones and the increase in the screen-to-body ratio of mobile phones make the space inside the mobile phone for front camera modules smaller and smaller; and the number of rear camera modules is increasing, and the area occupied by them is also increasing; as a result, the size of other configurations of mobile phones, such as the size of the battery and the size of the motherboard, is correspondingly reduced. In order to avoid the sacrifice of other configurations, the market hopes that the volume of the rear camera modules may be reduced, i.e., small-size packaging may be achieved.

Thirdly, with the popularization of high-pixel chips and the gradual improvement of functions such as video shooting, energy consumption of the chip and the fact that large chips are more prone to field curvature have become important issues, which need to be solved in the module design and manufacturing process.

In addition, most of the circuit boards of the camera module are rigid-flexible combination boards, which includes a hard board, a flexible board electrically connected to the hard board, and an electrical connector electrically connected to the flexible board, so that the camera module may be electrically connected to other electronic devices via the electrical connector, and the electrical connection between the hard board and the flexible board is usually realized by ACF (anisotropic conductive film). However, limited by the properties of ACF and the conduction process, the electrical connecting structure formed by the hard board and the flexible board has certain defects, such as uncontrollable electrical conduction performance, high process temperature, and excessive pressing force. Therefore, an improved structure configuration and preparation resolution of the camera module is required to better adapt to the development trend of the camera module.

CONTENTS OF THE INVENTION

The main object of the present application is to provide a photosensitive assembly, a preparation method thereof, and a camera module, wherein a photosensitive chip in the photosensitive assembly is electrically connected to a circuit board by directly contacting a conducting medium disposed on the circuit board, and in this way, an existing configuration manner of electrically connecting the photosensitive chip and the circuit board by wires is cancelled, so as to shorten the conduction distance, enhance the conductivity and signal transmission ability, and reduce the loss of the signal during the transmission process.

Another object of the present application is to provide a photosensitive assembly, a preparation method thereof, and a camera module, wherein a photosensitive chip is electrically connected to a circuit board by being pressed against a conducting medium disposed on the circuit board, and the photosensitive chip is bonded to the circuit board via a non-conducting adhesive disposed on the conducting medium, which ensures the stability of the electrical connection between the photosensitive chip and the circuit board, that is to say, compared with the existing FC process, in an example of the present application, the stable electrical connection between the photosensitive chip and the circuit board with relatively low cost and relatively low process difficulty is realized.

Another object of the present application is to provide a photosensitive assembly, a preparation method thereof, and a camera module, wherein during a process of electrically connecting a photosensitive chip to a circuit board, the photosensitive assembly is at a relatively low temperature (at 80-150°), that is to say, in this example of the present application, the process of electrically connecting the photosensitive chip to the circuit board is performed at a relatively low temperature, accordingly on one hand the difficulty of the process is reduced, and on the other hand the amount of expansion/contraction of a non-conducting adhesive disposed between the photosensitive chip and the circuit board is reduced, thereby reducing the deformability of the non-conducting adhesive to the photosensitive chip.

Another object of the present application is to provide a photosensitive assembly, a preparation method thereof, and a camera module, wherein a photosensitive chip is disposed on a lower surface of a circuit board, and in this example of the present application, a filter element may be directly disposed on an upper surface of the circuit board, that is to say, in this example of the present application, the photosensitive assembly is not provided with a traditional bracket structure, so that the overall height of the photosensitive assembly and/or the camera module may be reduced.

Another object of the present application is to provide a photosensitive assembly, a preparation method thereof, and a camera module, wherein a photosensitive chip is disposed on a back side of a circuit board, and such a structural configuration may increase the optical back focal length of the camera module, so as to ensure that the camera module may be configured with an optical lens with a longer focal length on the premise that the thickness of the camera module is reduced.

Another object of the present application is to provide a circuit board assembly, a photosensitive assembly, a camera module, and a preparation method for the circuit board assembly, wherein an electrical connection and a non-electrical connection between a circuit board main body and an electrical connecting plate may be synchronously realized via an integral connecting structure formed by a conducting medium and a non-conducting adhesive which are disposed between the circuit board main body and the electrical connecting plate, and this way, the stability of the electrical connection between the circuit board main body and the electrical connecting plate are improved.

Another object of the present application is to provide a circuit board assembly, a photosensitive assembly, a camera module, and a preparation method for the circuit board assembly, wherein the conducting medium in the integral connecting structure is vertically and horizontally in contact with the circuit board main body and the electrical connecting plate, so as to improve the electrical conductivity (especially the conductivity in the vertical direction).

Another object of the present application is to provide a circuit board assembly, a photosensitive assembly, a camera module and a preparation method for the circuit board assembly, wherein the integral connecting structure has a deformable property, and in a possible implementation manner of the present application, while the electrical connecting plate is electrically connected to the circuit board main body by being pressed against the conducting medium disposed on circuit board electrical connecting terminals, the electrical connecting plate is bonded to the circuit board main body via a non-conducting adhesive disposed on the conducting medium, and in this way, the electrical connection and non-electrical connection between the circuit board main body and the electrical connecting plate may be realized simultaneously, thereby ensuring the stability of the electrical connection between the circuit board main body and the electrical connecting plate.

Another object of the present application is to provide a circuit board assembly, a photosensitive assembly, a camera module and a preparation method for the circuit board assembly, wherein the integral connecting structure has a deformable property, and in a possible implementation manner of the present application, while the circuit board main body is electrically connected to the electrical connecting plate by being pressed against the conducting medium disposed on connecting plate electrical connecting terminals, the circuit board main body is bonded to the electrical connecting plate via a non-conducting adhesive disposed on the conducting medium, and in this way, the electrical connection and non-electrical connection between the circuit board main body and the electrical connecting plate may be realized simultaneously, thereby ensuring the stability of the electrical connection between the circuit board main body and the electrical connecting plate.

Another object of the present application is to provide a circuit board assembly, a photosensitive assembly, a camera module and a preparation method for the circuit board assembly, wherein the pressing force required for pressing the circuit board main body against the electrical connecting plate or pressing the electrical connecting plate against the circuit board main body is relatively small of about 0.5-5N, that is to say, in an example of the present application, the electrical connection and the non-electrical connection between the circuit board main body and the electrical connecting plate may be realized simultaneously with a small pressing force, and the process difficulty is lower.

Another object of the present application is to provide a circuit board assembly, a photosensitive assembly, a camera module and a preparation method for the circuit board assembly, wherein during a process that the circuit board main body is electrically connected and bonded to the electrical connecting plate via the integral connecting structure, the circuit board assembly is heated to a relatively low temperature (at 80-150°), that is to say, in an example of the present application, the process of electrically connecting the electrical connecting plate to the circuit board main body is performed at a relatively low temperature, accordingly on one hand the difficulty of the process is reduced, and on the other hand the amount of expansion/contraction of the non-conducting adhesive disposed between the circuit board main body and the electrical connecting plate is reduced, thereby reducing the deformation ability of the non-conducting adhesive to the circuit board main body, and improving the flatness of the circuit board main body.

Another object of the present application is to provide a circuit board assembly, a photosensitive assembly, a camera module and a preparation method for the circuit board assembly, wherein the process for electrically connecting the electrical connecting plate to the circuit board main body is performed under relatively low temperature, accordingly the self-expansion amount of the circuit board main body will be relatively reduced, thereby reducing the the bending amount of the circuit board main body.

Another object of the present application is to provide a circuit board assembly, a photosensitive assembly, a camera module, and a preparation method for the circuit board assembly, wherein in a possible implementation manner of the present application, the non-conducting adhesive in the integral connecting structure covers the connecting plate electrical connecting terminal and the conducting medium, so that the two adjacent connecting plate electrical connecting terminals are isolated by the non-conducting adhesive, thereby preventing a short circuit between the two connecting plate electrical connecting terminals.

Another object of the present application is to provide a circuit board assembly, a photosensitive assembly, a camera module, and a preparation method for the circuit board assembly, wherein in a possible implementation manner of the present application, the non-conducting adhesive in the integral connecting structure covers the circuit board electrical connecting terminal and the conducting medium, so that the two adjacent circuit board electrical connecting terminals are isolated by the non-conducting adhesive, thereby preventing a short circuit between the two circuit board electrical connecting terminals.

Other advantages and features of the application will become apparent from the description below, and may be realized by means and combinations particularly pointed out in the claims.

In order to achieve at least one of the above objects or advantages, the present application provides a photosensitive assembly, which includes:
- a circuit board, which includes a circuit board main body,
  - a through hole formed through the circuit board main body, a set of circuit board electrical connecting terminals disposed on a lower surface of the circuit board main body, a conducting medium disposed on the circuit board electrical connecting terminals, and a non-conducting adhesive covering the conducting medium and the circuit board electrical connecting terminals; and
- a photosensitive chip, wherein an upper surface of the photosensitive chip includes a photosensitive area, a non-photosensitive area located around the photosensitive area, and chip electrical connecting terminals disposed in the non-photosensitive area;

wherein the chip electrical connecting terminals of the photosensitive chip corresponds to the circuit board electrical connecting terminals of the circuit board, and the chip electrical connecting terminals are in contact with the conducting medium to be electrically connected to the circuit board electrical connecting terminals, and the photosensitive chip is bonded to the lower surface of the circuit board via the non-conducting adhesive, so that the photosensitive chip is electrically connected to the circuit board;

wherein the photosensitive area of the photosensitive chip corresponds to the through hole, so that external light reach the photosensitive area via the through hole.

In the photosensitive assembly according to the present application, the chip electrical connecting terminals are pressed against the conducting medium to be electrically connected to the circuit board electrical connecting terminals.

In the photosensitive assembly according to the present application, during the process of electrically connecting the photosensitive chip to the circuit board, the photosensitive assembly is heated to a specific temperature range, wherein the conducting medium has deformable property within the specific temperature range, and the non-conducting adhesive is cured in the specific temperature range.

In the photosensitive assembly according to the present application, the specific temperature range is 80°-150°.

In the photosensitive assembly according to the present application, the conducting medium is a mixture of metal particles and viscous substance.

In the photosensitive assembly according to the present application, the conducting medium has a circular convex shape.

In the photosensitive assembly according to the present application, a size of the conducting medium is smaller than that of the circuit board electrical connecting terminal, and the conducting medium covers a part of the circuit board electrical connecting terminal.

In the photosensitive assembly according to the present application, a size of the conducting medium is equal to that of the circuit board electrical connecting terminal, and the conducting medium completely covers the circuit board electrical connecting terminal.

In the photosensitive assembly according to the present application, a size of the conducting medium is larger than that of the circuit board electrical connecting terminal, and the conducting medium covers the circuit board electrical connecting terminal therein.

In the photosensitive assembly according to the present application, the conducting medium further includes a conductive film formed on the surface thereof.

In the photosensitive assembly according to the present application, a lower surface of the circuit board located around the through hole is recessed upward to form a groove communicating with the through hole, wherein the circuit board electrical connecting terminals are disposed within the groove.

In the photosensitive assembly according to the present application, the photosensitive chip is mounted in a receiving cavity defined by the groove and the through hole, and a bottom surface of the photosensitive chip is flush with the lower surface of the circuit board.

In the photosensitive assembly according to the present application, the photosensitive chip is mounted in a receiving cavity defined by the groove and the through hole, wherein a bottom surface of the photosensitive chip protrudes from the lower surface of the circuit board.

In the photosensitive assembly according to the present application, the photosensitive chip is mounted in a receiving cavity defined by the groove and the through hole, wherein the bottom surface of the photosensitive chip is lower than the lower surface of the circuit board.

In the photosensitive assembly according to the present application, the photosensitive assembly further includes at least one electronic component disposed on the upper surface of the circuit board, or the lower surface of the circuit board, or both of the upper surface and the lower surface of the circuit board.

In the photosensitive assembly according to the present application, the photosensitive assembly further includes a packaging body which is integrally formed on the lower surface of the circuit board and embeds at least a part of the lower surface of the circuit board, the photosensitive chip, and at least a part of at least one electronic component disposed on the lower surface of the circuit board.

In the photosensitive assembly according to the present application, the photosensitive assembly further includes a shielding case which is disposed on the lower surface of the circuit board and covers the photosensitive chip therein.

In the photosensitive assembly according to the present application, the photosensitive assembly further includes a packaging body which is integrally formed on the lower surface of the circuit board and embeds at least a part of the lower surface of the circuit board, the shielding case, and at least a part of at least one electronic component disposed on the lower surface of the circuit board.

In the photosensitive assembly according to the present application, the photosensitive assembly further includes a packaging body which is mounted on the lower surface of the circuit board and embeds at least a part of the lower surface of the circuit board, the shielding case, and at least a part of at least one electronic component disposed on the lower surface of the circuit board.

In the photosensitive assembly according to the present application, the photosensitive assembly further includes a reinforcing plate disposed on the lower surface of the circuit board.

In the photosensitive assembly according to the present application, the photosensitive assembly further includes a filter element which is disposed on the upper surface of the circuit board and corresponds to the through hole.

In the photosensitive assembly according to the present application, the photosensitive assembly further includes a flexible board connecting plate which is electrically connected to the circuit board and an electrical connector which is electrically connected to the flexible board connecting plate.

In the photosensitive assembly according to the present application, the flexible board connecting plate is integrally combined with the circuit board.

In the photosensitive assembly according to the present application, the flexible board connecting plate is mounted on and electrically connected to the upper surface of the circuit board.

In the photosensitive assembly according to the present application, the flexible board connecting plate is mounted on and electrically connected to the lower surface of the circuit board.

According to another aspect of the present application, also provided is a camera module, which includes:
an optical lens as described above; and
a photosensitive assembly, wherein the optical lens is maintained on a photosensitive path of the photosensitive assembly.

In the camera module according to the present application, the camera module further includes a driving element, wherein the driving element is mounted on the photosensitive assembly, and the optical lens is mounted on the driving element.

According to another aspect of the present application, also provided is a preparation method for a photosensitive assembly, which includes:

providing a circuit board and a photosensitive chip, wherein the circuit board includes a circuit board main body, a through hole formed through the circuit board main body, a set of circuit board electrical connecting terminals disposed on a lower surface of the circuit board main body, and an upper surface of the photosensitive chip includes a photosensitive area, a non-photosensitive area located around the photosensitive area, and chip electrical connecting terminals disposed in the non-photosensitive area;

forming a conducting medium on the circuit board electrical connecting terminals respectively;

applying a non-conducting adhesive on the conducting medium; and pressing the chip electrical connecting terminals against the conducting medium to electrically connect the chip electrical connecting terminals to the circuit board electrical connecting terminals, and bonding the photosensitive chip on the lower surface of the circuit board via the non-conducting adhesive, so that the photosensitive chip is electrically connected to the circuit board.

In the preparation method according to the present application, during the process of pressing the chip electrical connecting terminals against the conducting medium to electrically connect the chip electrical connecting terminals to the circuit board electrical connecting terminals, and bonding the photosensitive chip on the lower surface of the circuit board via the non-conducting adhesive, the photosensitive chip and the circuit board are heated to a temperature range of 80°-150°, wherein in the temperature range, the conducting medium has deformable property and the non-conducting adhesive is cured at the same time.

In the preparation method according to the present application, forming a conducting medium on the circuit board electrical connecting terminals respectively includes:

providing a layer of mask on the lower surface of the circuit board, wherein the mask has a series of openings passing through it and corresponding to the circuit board electrical connecting terminals respectively;

applying excess conducting medium on the mask;

removing the redundant conducting medium from the surface of the mask; and removing the mask to form the conducting medium at positions corresponding to the openings.

In the preparation method according to the present application, a size of the opening is smaller than that of the circuit board electrical connecting terminal.

In the preparation method according to the present application, a size of the opening corresponds to the circuit board electrical connecting terminal.

In the preparation method according to the present application, a size of the opening is larger than that of the circuit board electrical connecting terminal.

In the preparation method according to the present application, after forming a conducting medium on the circuit board electrical connecting terminals respectively, and before applying a non-conducting adhesive on the conducting medium, the method includes:

forming a conductive film on the surface of the conducting medium.

In the preparation method according to the present application, the preparation method further includes:

integrally forming a packaging body on the lower surface of the circuit board, wherein the packaging body embeds at least a part of the lower surface of the circuit board, the photosensitive chip, and at least a part of at least one electronic component disposed on the lower surface of the circuit board.

In the preparation method according to the present application, the preparation method further includes:

providing a shielding case on the lower surface of the circuit board, wherein the shielding case covers the photosensitive chip therein; and integrally forming a packaging body on the lower surface of the circuit board, wherein the packaging body is integrally formed on the lower surface of the circuit board, and embeds at least a part of the lower surface of the circuit board, the shielding case, and at least a part of at least one electronic component disposed on the lower surface of the circuit board.

In the preparation method according to the present application, the preparation method further includes:

providing a shielding case on the lower surface of the circuit board, wherein the shielding case covers the photosensitive chip therein; and mounting a packaging body on the lower surface of the circuit board, wherein the packaging body embeds at least a part of the lower surface of the circuit board, the shielding case, and at least one electronic component disposed on the lower surface of the circuit board.

In the preparation method according to the present application, the preparation method further includes:

mounting a reinforcing plate on the lower surface of the circuit board, wherein the reinforcing plate covers at least a part of the lower surface of the circuit board, the photosensitive chip, and at least one electronic component disposed on the lower surface of the circuit board.

In the preparation method according to the present application, the preparation method further includes:

providing a filter element on the upper surface of the circuit board, wherein the filter element corresponds to the through hole of the circuit board.

In another aspect of the present application, also provided is a circuit board assembly, which includes:

a circuit board main body, which has a circuit board electrical connecting terminal disposed on the surface thereof;

an electrical connecting plate, which has a connecting plate electrical connecting terminal disposed on the surface thereof and corresponds to the circuit board electrical connecting terminal;

an integral connecting structure, which is disposed between the connecting plate electrical connecting terminal and the circuit board electrical connecting terminal, wherein the integral connecting structure includes a conducting medium and a non-conducting adhesive adjacent to each other, and while the connecting plate electrical connecting terminal is electrically connected to the circuit board electrical connecting terminal via the conducting medium, the electrical connecting plate is bonded to the circuit board main body via the non-conducting adhesive, so that the electrical connecting plate is electrically connected to the circuit board main body; and an electrical connector, which is electrically connected to the electrical connecting plate.

In the circuit board assembly according to the present application, the conducting medium and the non-conducting adhesive have a layered structure, and the conducting medium is formed at the circuit board electrical connecting terminal, and the non-conducting adhesive is applied to the conducting medium to form the integral connecting structure.

In the circuit board assembly according to the present application, the conducting medium and the non-conducting adhesive have a layered structure, and the conducting medium is formed at the connecting plate electrical connecting terminal, and the non-conducting adhesive is applied to the conducting medium to form the integral connecting structure.

In the circuit board assembly according to the present application, the integral connecting structure has a deformable property, and while the electrical connecting plate is pressed against the integral connecting structure so that the connecting plate electrical connecting terminal is electrically connected to the circuit board electrical connecting terminal via the conducting medium, the electrical connecting plate is bonded to the circuit board main body via the non-conducting adhesive.

In the circuit board assembly according to the present application, the integral connecting structure has a deformable property, and while the circuit board main body is pressed against the integral connecting structure so that the circuit board electrical connecting terminal is electrically connected to the connecting plate electrical connecting terminal via the conducting medium, the circuit board main body is bonded to the electrical connecting plate via the non-conducting adhesive.

In the circuit board assembly according to the present application, the pressing force is 0.5-5N.

In the circuit board assembly according to the present application, the conducting medium is a mixture of metal particles and viscous substance.

In the circuit board assembly according to the present application, the viscous substance is a thermo-curing glue.

In the circuit board assembly according to the present application, the non-conducting adhesive is implemented as a thermo-curing glue.

In the circuit board assembly according to the present application, during the process of electrically connecting the electrical connecting plate to the circuit board main body, the circuit board assembly is heated to a specific temperature range, wherein the conducting medium has deformable property within the specific temperature range, and the non-conducting adhesive is cured in the specific temperature range.

In the circuit board assembly according to the present application, the specific temperature range is 80°-150°.

In the circuit board assembly according to the present application, a size of the conducting medium is smaller than that of the circuit board electrical connecting terminal, and the conducting medium covers a part of the circuit board electrical connecting terminal.

In the circuit board assembly according to the present application, a size of the conducting medium is equal to that of the circuit board electrical connecting terminal, and the conducting medium completely covers the circuit board electrical connecting terminal.

In the circuit board assembly according to the present application, a size of the conducting medium is larger than that of the circuit board electrical connecting terminal, and the conducting medium covers the circuit board electrical connecting terminal therein.

In the circuit board assembly according to the present application, the non-conducting adhesive covers the connecting plate electrical connecting terminal and the conducting medium, so that two adjacent connecting plate electrical connecting terminals are isolated by the non-conducting adhesive.

In the circuit board assembly according to the present application, a size of the conducting medium is smaller than that of the connecting plate electrical connecting terminal, and the conducting medium covers a part of the connecting plate electrical connecting terminal.

In the circuit board assembly according to the present application, a size of the conducting medium is equal to that of the connecting plate electrical connecting terminal, and the conducting medium completely covers the connecting plate electrical connecting terminal.

In the circuit board assembly according to the present application, a size of the conducting medium is larger than that of the connecting plate electrical connecting terminal, and the conducting medium covers the connecting plate electrical connecting terminal therein.

In the circuit board assembly according to the present application, the non-conducting adhesive covers the circuit board electrical connecting terminal and the conducting medium, so that two adjacent circuit board electrical connecting terminals are isolated by the non-conducting adhesive.

In the circuit board assembly according to the present application, the conducting medium has a circular convex shape.

In the circuit board assembly according to the present application, the conducting medium further includes a conductive film formed on the surface thereof.

In the circuit board assembly according to the present application, the electrical connecting plate is mounted and electrically connected to the upper surface of the circuit board main body.

In the circuit board assembly according to the present application, an edge area of the upper surface of the circuit board main body is recessed downward to form a concave part, and the electrical connecting plate is mounted and electrically connected to the concave part of the circuit board main body.

In the circuit board assembly according to the present application, the upper surface of the electrical connecting plate is flush with that of the circuit board main body.

In the circuit board assembly according to the present application, the electrical connecting plate is mounted and electrically connected to the lower surface of the circuit board main body.

In the circuit board assembly according to the present application, an edge area of the lower surface of the circuit board main body is recessed upward to form a concave part, and the electrical connecting plate is mounted and electrically connected to the concave part of the circuit board main body.

In the circuit board assembly according to the present application, the lower surface of the electrical connecting plate is flush with that of the circuit board main body.

According to another aspect of the present application, also provided is a photosensitive assembly, which includes:
the circuit board assembly as described above; and a photosensitive chip electrically connected to the circuit board main body.

According to another aspect of the present application, also provided is a camera module, which includes:
a photosensitive assembly, wherein the photosensitive assembly includes:
the circuit board assembly as described above; and
a photosensitive chip electrically connected to the circuit board main body; and
an optical lens maintained on the photosensitive path of the photosensitive assembly.

According to another aspect of the present application, also provided is a preparation method for a circuit board assembly, which includes:
providing a circuit board main body and an electrical connecting plate, wherein the circuit board main body has circuit board electrical connecting terminals disposed on the surface thereof, and the electrical connecting plate has connecting plate electrical connecting terminals disposed on the surface thereof;
forming a conducting medium on the circuit board electrical connecting terminals respectively;
applying a non-conducting adhesive on the conducting medium;
pressing the connecting plate electrical connecting terminals against the conducting medium to electrically connect the connecting plate electrical connecting terminals to the circuit board electrical connecting terminals, and bonding the electrical connecting plate on the circuit board main body via the non-conducting adhesive at the same time, so that the electrical connecting plate is electrically connected to the circuit board main body; and
electrically connecting an electrical connector to the electrical connecting plate.

In the preparation method according to the present application, during the process of pressing the connecting plate electrical connecting terminals against the conducting medium to electrically connect the connecting plate electrical connecting terminals to the circuit board electrical connecting terminals, and bonding the electrical connecting plate on the circuit board main body via the non-conducting adhesive,
the electrical connecting plate and the circuit board main body are heated to a temperature range of 80°-150°, wherein in the temperature range, the conducting medium has deformable property and the non-conducting adhesive is cured at the same time.

In the preparation method according to the present application, the pressing force is 0.5-5N.

In the preparation method according to the present application, forming a conducting medium on the circuit board electrical connecting terminals respectively includes:
providing a layer of mask on the circuit board main body, wherein the mask has a series of openings passing through it and corresponding to the circuit board electrical connecting terminals respectively;
applying excess conducting medium on the mask;
removing the redundant conducting medium from the surface of the mask; and
removing the mask to form the conducting medium at positions corresponding to the openings.

In the preparation method according to the present application, after forming a conducting medium on the circuit board electrical connecting terminals respectively, and before applying a non-conducting adhesive on the conducting medium, the method includes:
forming a conductive film on the surface of the conducting medium.

According to yet another aspect of the present application, also provided is a preparation method for an electric circuit board assembly, which includes:
providing a circuit board main body and an electrical connecting plate, wherein the circuit board main body has circuit board electrical connecting terminals disposed on the surface thereof, and the electrical connecting plate has connecting plate electrical connecting terminals disposed on the surface thereof;
forming a conducting medium on the connecting plate electrical connecting terminals respectively;
applying a non-conducting adhesive on the conducting medium;
pressing the circuit board electrical connecting terminals against the conducting medium to electrically connect the connecting plate electrical connecting terminals to the circuit board electrical connecting terminals, and bonding the electrical connecting plate on the circuit board main body via the non-conducting adhesive, so that the electrical connecting plate is electrically connected to the circuit board main body; and
electrically connecting an electrical connector to the electrical connecting plate.

In the preparation method according to the present application, during the process of pressing the circuit board electrical connecting terminals against the conducting medium to electrically connect the connecting plate electrical connecting terminals to the circuit board electrical connecting terminals, and bonding the electrical connecting plate on the circuit board main body via the non-conducting adhesive,
the electrical connecting plate and the circuit board main body are heated to a temperature range of 80°-150°, wherein in the temperature range, the conducting medium has deformable property and the non-conducting adhesive is cured at the same time.

In the preparation method according to the present application, the pressing force is 0.5-5N In the preparation method according to the present application, forming a conducting medium on the connecting plate electrical connecting terminals respectively includes:
providing a layer of mask on the electrical connecting plate, wherein the mask has a series of openings passing through it and corresponding to the circuit board electrical connecting terminals respectively;
applying excess conducting medium on the mask;
removing the redundant conducting medium from the surface of the mask; and
removing the mask to form the conducting medium at positions corresponding to the openings.

In the preparation method according to the present application, after forming a conducting medium on the connecting plate electrical connecting terminals respectively, and before applying a non-conducting adhesive on the conducting medium, the method includes:
forming a conductive film on the surface of the conducting medium.

Further objects and advantages of the present application will be fully realized by an understanding of the following description and drawings.

These and other objects, features and advantages of the present application are fully embodied by the following detailed description, drawings and claims.

BRIEF DESCRIPTION OF THE DRAWINGS

The above and other objects, features and advantages of the present application will become more apparent from the detailed description of the examples of the present application in conjunction with the accompanying drawings. The accompanying drawings are used to provide a further understanding of the examples of the present application, constitute a part of the specification, and are used to explain the present application together with the examples of the present application, and do not constitute a limitation to the present application. In the drawings, the same reference numbers generally refer to the same components or steps.

SPECIFIC EXAMPLES

Hereinafter, exemplary examples according to the present application will be described in detail with reference to the accompanying drawings. Obviously, the described examples are only a part of the examples of the present application, rather than all the examples of the present application, and it should be understood that the present application is not limited by the exemplary examples described herein.

Exemplary Camera Module and Photosensitive Assembly Thereof

Figure 1:
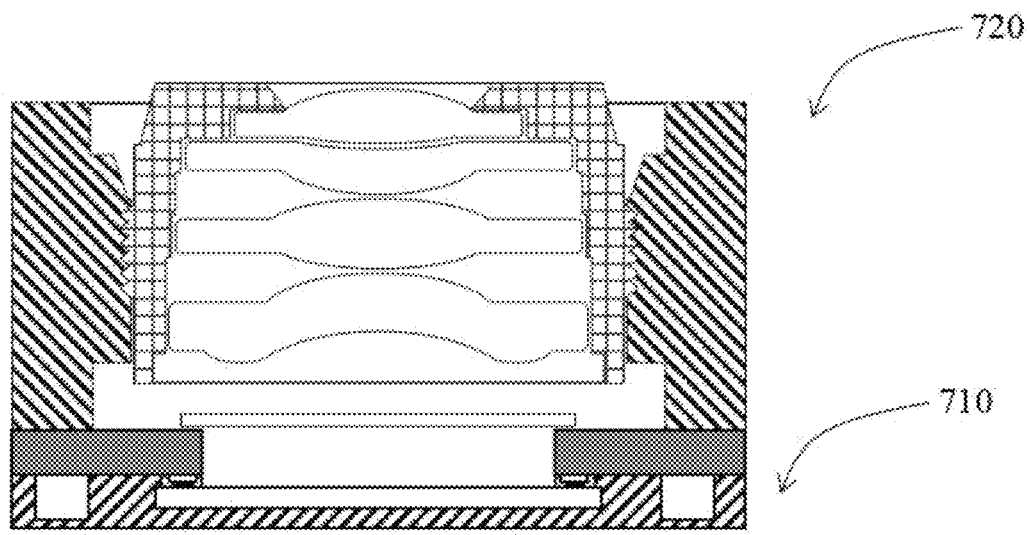
FIG. 1 is a schematic diagram illustrating a camera module according to an example of the present application.

As shown in FIG. 1, a camera module according to an example of the present application is illustrated. The camera module includes a photosensitive assembly 710 and an optical lens 720 disposed on a photosensitive path of the photosensitive assembly 710, so that light collected by the optical lens 720 may generate an imaging effect at the photosensitive assembly 710.

As shown in FIG. 1, in an example of the present application, the photosensitive assembly 710 includes a circuit board 711 and a photosensitive chip 712 electrically connected to a lower surface of the circuit board 711. That is, in an example of the present application, the photosensitive chip 712 is electrically connected to a back surface of the circuit board 711. In particular, although in an example of the present application, the photosensitive chip 712 is mounted and electrically connected to the back surface of the circuit board 711, the manners of mounting and electrical connection are apparently different from those of a conventional method in disposing the photosensitive chip 712 on the back surface of the circuit board 711 through FC process (Flip Chip).

Figure 2:
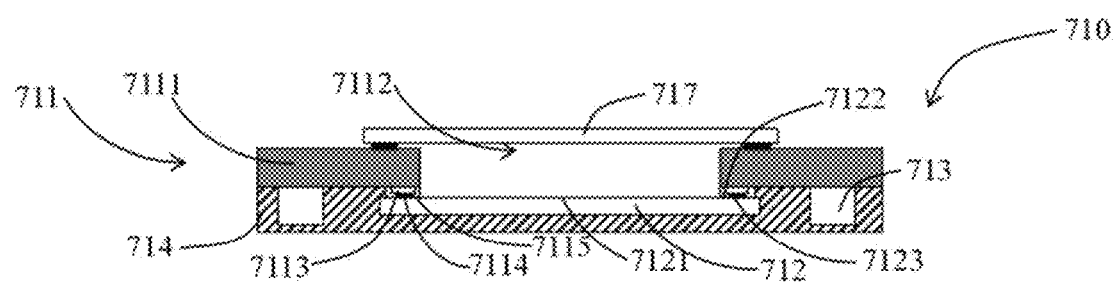
FIG. 2 is a schematic diagram illustrating a photosensitive assembly of the camera module according to an example of the application.

Particularly, as shown in FIG. 2, in an example of the present application, the circuit board 711 includes a circuit board main body 7111, a through hole 7112 formed through the circuit board main body 7111, a set of circuit board electrical connecting terminals 7113 disposed on a lower surface of the circuit board main body 7111, a conducting medium 7114 disposed on the circuit board electrical connecting terminals 7113, and a non-conducting adhesive 7115 covering the conducting medium 7114 and the circuit board electrical connecting terminals 7113. The photosensitive chip 712 includes a photosensitive area 7121 disposed on an upper surface thereof, a non-photosensitive area 7121 located around the photosensitive area 7121, and chip electrical connecting terminals 7122 disposed on the non-photosensitive area 7121. Particularly, as shown in FIG. 2, in an example of the present application, the chip electrical connecting terminal 7122 of the photosensitive chip 712 corresponds to the circuit board electrical connecting terminal 7113 of the circuit board 711, and the chip electrical connecting terminal 7122 is in contact with the conducting medium 7114 to be electrically connected to the circuit board electrical connecting terminal 7113, and the photosensitive chip 712 is bonded to the lower surface of the circuit board 711 via the non-conducting adhesive 7115, so that the photosensitive chip 712 is electrically connected to the circuit board 711. In addition, when the photosensitive chip 712 is mounted and electrically connected to the lower surface of the circuit board 711, the photosensitive area 7121 of the photosensitive chip 712 corresponds to the through hole 7112, so that external light may pass the through hole 7112 to reach the photosensitive area 7121.

Those of ordinary skill in the art should know that in the existing FC process, the first way to mount and electrically connect the photosensitive chip to the lower surface of the circuit board is: to dispose conductive silver adhesive between the photosensitive chip and the circuit board, so that the photosensitive chip is electrically connected to the circuit board via the conductive silver adhesive. Although this method may realize the electrical connection between the photosensitive chip and the circuit board, since the bonding strength between the photosensitive chip and the circuit board only depends on the conductive silver adhesive (i.e., the conductive silver adhesive not only exists as a conducting medium, but also acts as an adhesive between the above two components); such a way leads to a low bonding strength between the photosensitive chip and the circuit board, and the stability of electrical connection between the photosensitive chip and the circuit board is not high. And, the second way to mount and electrically connect the photosensitive chip to the lower surface of the circuit board is: to generate a tin ball array on the chip electrical connecting terminal of the photosensitive chip, and then soldering the tin ball of the chip electrical connecting terminal of photosensitive chip to the circuit board electrical connecting terminal by ultrasonic soldering or other methods, and in this way, the photosensitive chip is electrically connected to the circuit board. Although this method may realize the mounting and electrical connection of the photosensitive chip to the circuit board, the process is difficult and the high temperature generated during soldering will affect the performance of the photosensitive assembly (for example, the photosensitive chip is deformed, etc.).

Correspondingly, in an example of the present application, the photosensitive chip 712 is mounted and electrically connected to the lower surface of the circuit board 711 in the following manner: the chip electrical connecting terminal 7122 is in contact with the conducting medium 7114 so as to electrically connect to the circuit board electrical connecting terminal 7113, and the photosensitive chip 712 is bonded to the lower surface of the circuit board 711 via the non-conducting adhesive 7115. That is to say, in an example of the present application, the bonding between the circuit board 711 and the photosensitive chip 712 is realized by the non-conducting adhesive 7115, and the electrical connection between the circuit board 711 and the photosensitive chip 712 is realized by the conducting medium 7114. In other words, in an implementation of the present application, the bonding between the circuit board 711 and the photosensitive chip 712, and the electrical connection between the circuit board 711 and the photosensitive chip 712 are respectively realized through different media. Such a process may simultaneously take into account the bonding strength of the photosensitive chip 712 and the circuit board 711, and the stability of the electrical connection between the photosensitive chip 712 and the circuit board 711, furthermore, the process may also be implemented at relatively low temperature with lower cost.

In particular, in this example of the present application, the key point to implementing this process is that: there is a special relationship between the properties of the conducting medium 7114 and the non-conducting adhesive 7115. Particularly, the conducting medium 7114 and the non-conducting adhesive 7115 are configured to have the following properties: during the process of electrically connecting the photosensitive chip 712 to the circuit board 711, the photosensitive assembly 710 is heated to a specific temperature range in which the conducting medium 7114 has deformable property; and at the same time, the non-conducting adhesive 7115 is cured within the specific temperature range. Due to the special property relationship between the conducting medium 7114 and the non-conducting adhesive 7115, during the process of electrically connecting the photosensitive chip 712 to the circuit board 711, the chip electrical connecting terminal 7122 of the photosensitive chip 712 may pass through the non-conducting adhesive 7115 that is not fully cured to be in contact with the conducting medium 7114, and is electrically connected to the circuit board electrical connecting terminal 7113 of the circuit board 711 in this way. Meanwhile the non-conducting adhesive 7115 is also slowly cured, so that after the photosensitive chip 712 is electrically connected to the lower surface of the circuit board 711, the photosensitive chip 712 is also firmly fixed on the lower surface of the circuit board 711 via the non-conducting adhesive 7115.

More particularly, in an example of the present application, the conducting medium 7114 is implemented as a mixture of metal particles (when the diameter of the particles is smaller than a certain threshold, the metal particles is implemented as metal powder) and viscous substance, wherein the metal particles may be gold, silver, aluminum, copper, metal alloy, nonmetal-metal alloy, etc., and the viscous substance may be epoxy resin, ink, and the like. In particular, through special material selection and composition, the conducting medium 7114 has good electrical conductivity, and the property of the viscous substance in the conducting medium 7114 may be adjusted to make the conducting medium 7114 to be cured in a temperature range of 80-200 degrees Celsius. Meanwhile, in an example of the present application, the non-conducting adhesive 7115 includes a resin material (such as epoxy resin or polyimide resin), which is cured in a temperature range of 80-200 degrees Celsius. Particularly, in an example of the present application, during the process of electrically connecting the photosensitive chip 712 to the circuit board 711, the photosensitive assembly 710 is heated to a specific temperature range, and preferably the specific temperature range is 80-150 degrees Celsius.

Figure 3A:
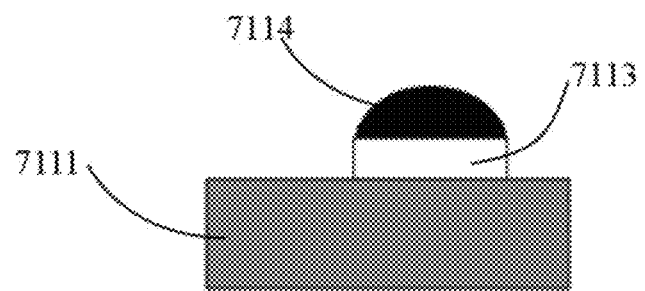
FIG. 3A is a schematic diagram illustrating a modified implementation of a conducting medium and a circuit board electrical connecting terminal according to an example of the present application.
Figure 3B:
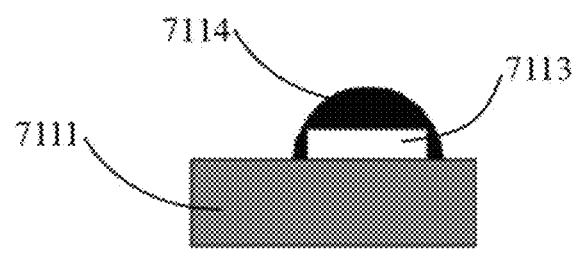
FIG. 3B is a schematic diagram illustrating another modified implementation of a conducting medium and a circuit board electrical connecting terminal according to an example of the present application.

Further, as shown in FIG. 2, in an example of the present application, the conducting medium 7114 is disposed on the circuit board conductive terminal 7113 of the circuit board 711, and has a circular convex shape (the reason for this shape is the surface tension of the conducting medium 7114). Particularly, in an example of the present application, the size of the conducting medium 7114 is smaller than that of the circuit board electrical connecting terminal 7113, and the conducting medium 7114 covers a part of the circuit board electrical connecting terminal 7113. Such a dimensional relationship configuration may effectively control the conducting medium 7114 within the range of the circuit board electrical connecting terminal 7113, and prevent the conducting medium 7114 from overflowing and contaminating the structure of the circuit board 711 during the process of electrically connecting the photosensitive chip 712 to the circuit board 711. Of course, in other examples of the present application, the size relationship between the conducting medium 7114 and the circuit board electrical connecting terminal 7113 may also be configured in other types, for example, the size of the conducting medium 7114 is equal to that of the circuit board electrical connecting terminal 7113, and the conducting medium 7114 completely covers the circuit board electrical connecting terminal 7113 (as shown in FIG. 3A); alternatively, the size of the conducting medium 7114 is larger than that of the circuit board electrical connecting terminal 7113, and the conducting medium 7114 covers the circuit board electrical connecting terminal 7113 therein (as shown in FIG. 3B); in this regard, it is not limited by this application. It is worth mentioning that, when the size of the conducting medium 7114 is equal to that of the circuit board electrical connecting terminal 7113, and the conducting medium 7114 completely covers the circuit board electrical connecting terminal 7113, the contact area between the conducting medium 7114 and the circuit board electrical connecting terminal 7113 is increased, and the electrical conductivity is enhanced. When the size of the conducting medium 7114 is larger than that of the circuit board electrical connecting terminal 7113, and the conducting medium 7114 covers the circuit board electrical connecting terminal 7113 therein, the contact area between the conducting medium 7114 and the circuit board electrical connecting terminal 7113 is maximized, and the electrical conductivity is further enhanced. However, it should be noted that, when the size of the conducting medium 7114 is larger than that of the circuit board electrical connecting terminal 7113, and the conducting medium 7114 covers the circuit board electrical connecting terminal 7113 therein, it is necessary to control the conducting mediums 7114 disposed on different circuit board electrical connecting terminals 7113 to be isolated from each other, thereby preventing the circuit from being short-circuit and failing.

Further, as shown in FIG. 2, in an example of the present application, the non-conducting adhesive 7115 is applied on the conducting medium 7114, and preferably completely covers the conducting medium 7114 and the circuit board electrical connecting terminal 7113. Of course, in other examples of the present application, the non-conducting adhesive 7115 may also cover at least a part of the lower surface of the circuit board 711, so as to enhance the bonding strength between the photosensitive chip 712 and the circuit board 711; in this regard, it is not limited by this application.

Figure 4:
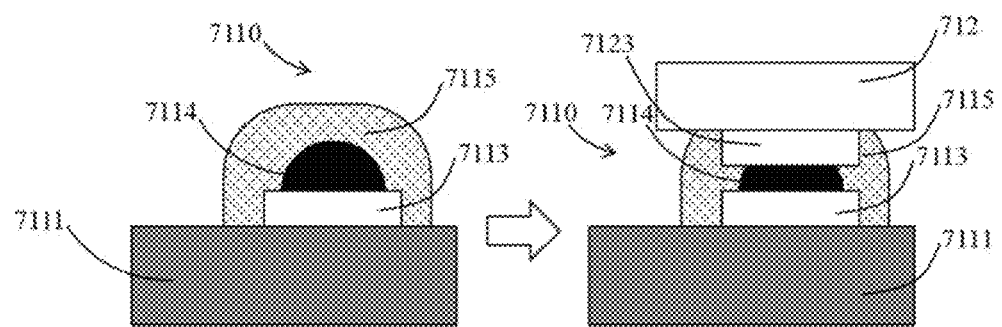
FIG. 4 is a schematic diagram illustrating a process in which the photosensitive chip is electrically connected to the circuit board according to an example of the present application.

FIG. 4 is a schematic diagram illustrating a process in which the photosensitive chip 712 is electrically connected to the circuit board 711 according to an example of the present application. As shown in FIG. 4, during the process of electrically connecting the photosensitive chip 712 to the circuit board 711 (the temperature of process environment is raised to 80-150 degrees Celsius); firstly, the photosensitive chip 712 is brought close to the circuit board 711, so that the chip electrical connecting terminal 7122 of the photosensitive chip 712 corresponds to the circuit board electrical connecting terminal 7113 of the circuit board 711; further, the distance between the photosensitive chip 712 and the circuit board 711 is gradually shortened (e.g., pressing down the photosensitive chip 712) so that the chip electrical connecting terminals 7122 of the photosensitive chip 712 pass the non-conducting adhesive 7115 that is not fully cured to contact with the conducting medium 7114, thereby realizing the electrical connection between the photosensitive chip 712 and the circuit board 711, and the conducting medium 7114 has a certain adhesiveness which may fix the photosensitive chip 712 thereon; then, the distance between the photosensitive chip 712 and the circuit board 711 is continuously shortened (for example, continuously pressing down the photosensitive chip 712), so that the chip electrical connecting terminal 7122 of the photosensitive chip 712 is pressed against the conducting medium 7114 to make the conductive medium 7114 deformed, thereby improving the stability of the electrical connection between the photosensitive chip 712 and the circuit board 711. At the same time, under this specific temperature of process environment, the non-conducting adhesive 7115 will also be gradually cured, so that during the process of electrically connecting the photosensitive chip 712 to the lower surface of the circuit board 711, the photosensitive chip 712 is also firmly attached to the lower surface of the circuit board 711 via the non-conducting adhesive 7115. In this way, on one hand, the stability of electrical connection between the photosensitive chip 712 and the circuit board 711 may be ensured; on the other hand, the bonding strength between the photosensitive chip 712 and the circuit board 711 may also be effectively ensured. That is to say, in an example of the present application, the photosensitive chip 712 is electrically connected to the lower surface of the circuit board 711, and the photosensitive chip 712 is bonded to the lower surface of the circuit board 711 almost simultaneously, so that the physical bonding between the photosensitive chip 712 and the circuit board 711 via the non-conducting adhesive 7115 may ensure the stability of the electrical connection between the photosensitive chip 712 and the circuit board 711.

Figure 5:
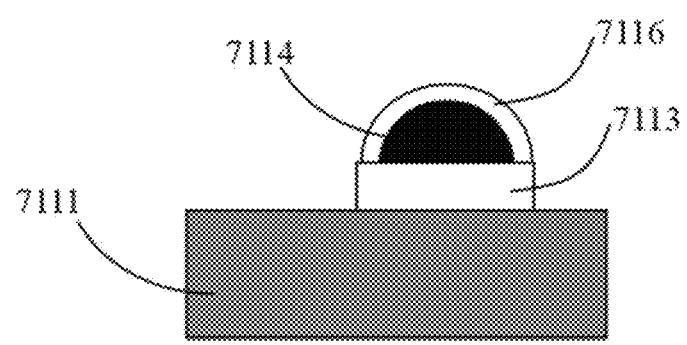
FIG. 5 is a schematic diagram illustrating yet another modified implementation of a conducting medium and a circuit board electrical connecting terminal according to an example of the present application.

In order to enhance the electrical conductivity between the chip electrical connecting terminal 7122 of the photosensitive chip 712 and the circuit board electrical connecting terminal 7113 of the circuit board 711, as shown in FIG. 5, in yet another modified example of the photosensitive assembly 710 according to an example of the application, the conducting medium 7114 further includes a conductive film 7116 formed on the surface thereof. Preferably, the conductive film 7116 completely covers the outer surface of the conducting medium 7114. In a particular implementation, the conductive film 7116 may be formed on the surface of the conducting medium 7114 by chemical plating or electroplating, wherein the coating material may be selected from gold, silver, aluminum, copper, and the like.

It should be understood that, in this example of the present application, the photosensitive chip 712 is electrically connected to the circuit board 711 by directly contacting the conducting medium 7114 disposed on the circuit board 711. In this way, the existing configuration in which the photosensitive chip 712 and the circuit board 711 are electrically connected by wires is cancelled, so as to shorten the conduction distance, enhance the conductivity and signal transmission ability, and reduce the loss of the signal during transmission.

Figure 6:
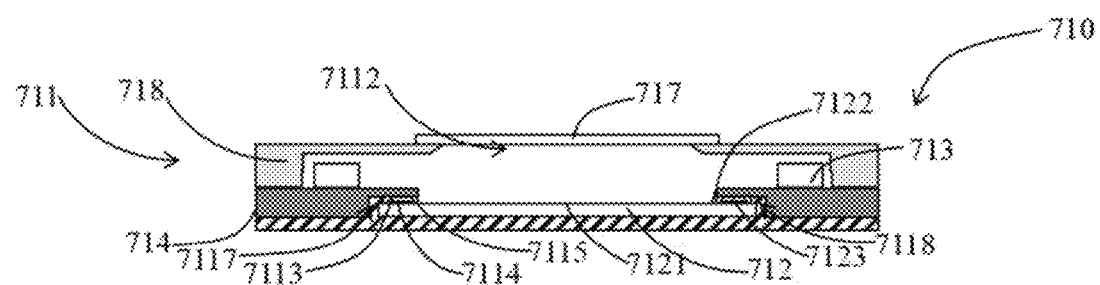
FIG. 6 is a schematic diagram illustrating yet another modified implementation of the photosensitive assembly according to an example of the present application.

FIG. 6 is a schematic diagram illustrating yet another modified implementation of the photosensitive assembly 710 according to an example of the present application, wherein in this modified implementation, a structural configuration of the circuit board main body 7111 is adjusted to change the manner of mounting the photosensitive chip 712 on the circuit board 711. Particularly, as shown in FIG. 6, in this modified implementation, the lower surface of the circuit board 711 located around the through hole 7112 is recessed upward to form a groove 7117 communicating with the through hole 7112, wherein the circuit board electrical connecting terminal 7113 is disposed within the groove 7117. It should be observed that, when the lower surface of the circuit board 711 located around the through hole 7112 is recessed upward, the groove 7117 and the through hole 7112 form a receiving cavity 7118, and the photosensitive chip 712 is mounted in the receiving cavity 7118. Particularly, in the photosensitive assembly 710 as shown in FIG. 6, the photosensitive chip 712 has a specific height, so that when the photosensitive chip 712 is mounted and electrically connected to the receiving cavity 7118 in the above-mentioned manner, the bottom surface of the photosensitive chip 712 is flush with the bottom surface of the circuit board 711, i.e., the photosensitive assembly 710 has a flat bottom surface.

Figure 7:
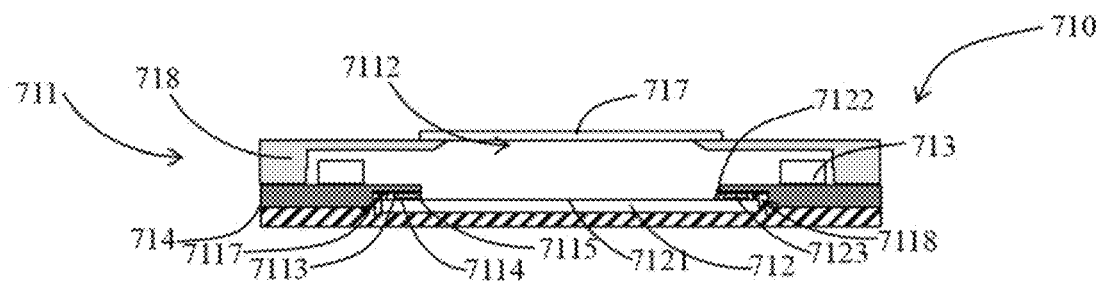
FIG. 7 is a schematic diagram illustrating yet another modified implementation of the photosensitive assembly according to an example of the present application.
Figure 8:
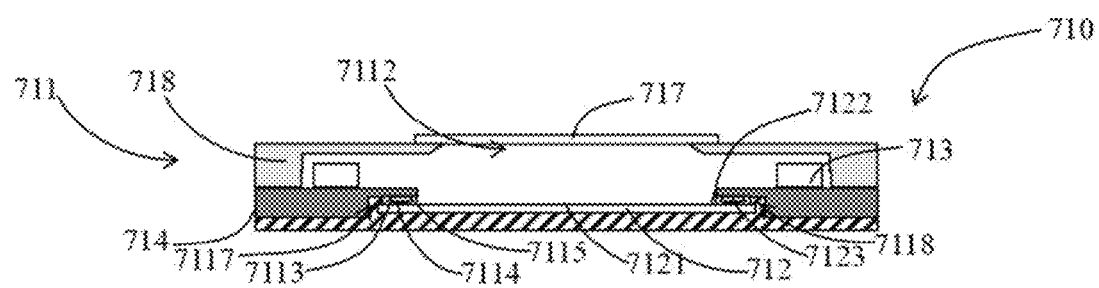
FIG. 8 is a schematic diagram illustrating yet another modified implementation of the photosensitive assembly according to an example of the present application.

Of course, those skilled in the art should understand that in other examples of the present application, the photosensitive chip 712 may also have other height configurations. For example, in another modified implementation of the photosensitive assembly 710 according to an example of the present application as shown in FIG. 7, the photosensitive chip 712 has a specific height, so that when the photosensitive chip 712 is mounted and electrically connected in the receiving cavity 7118 in the above-mentioned manner, the bottom surface of the photosensitive chip 712 protrudes from the bottom surface of the circuit board 711. For another example, in yet another modified implementation of the photosensitive assembly 710 according to an example of the present application as shown in FIG. 8, the bottom surface of the photosensitive chip 712 is lower than the bottom surface of the circuit board 711.

As shown in FIG. 2, in an example of the present application, the photosensitive assembly 710 further includes at least one electronic component 713 disposed on the circuit board 711. It should be understood that, in an example of the present application, since the photosensitive chip 712 is electrically connected to the lower surface of the circuit board 711, compared with the existing photosensitive assembly 710 packaged by the COB process, the upper surface of the circuit board 711 has a relatively larger area for mounting the electronic components 713. That is to say, preferably in an example of the present application, a relatively larger number of the electronic component 713 is disposed on the upper surface of the circuit board 711 (even all the electrical components are disposed on the upper surface of the circuit board 711), and a relatively small number of the electronic component 713 are disposed on the lower surface of the circuit board 711. Of course, in other examples of the present application, the at least one electronic component 713 may also be all disposed on the lower surface of the circuit board 711; in this regard, it is not limited by the present application. Those of ordinary skill in the art should know that, in the field of camera module, the electronic component 713 includes capacitor, resistor, inductor, and the like.

In order to protect the lower surface of the circuit board 711 and the photosensitive chip 712 mounted and electrically connected to the lower surface of the circuit board 711, as shown in FIG. 2, in an example of the present application, the photosensitive assembly 710 further includes a packaging body 714, wherein the packaging body 714 is integrally formed on the lower surface of the circuit board 711, and embeds at least a part of the lower surface of the circuit board 711, the photosensitive chip 712, and at least a part of at least one electronic component 713 disposed on the lower surface of the circuit board 711. In a particular implementation, the packaging body 714 may be integrally formed on the lower surface of the circuit board 711 by a molding process or mold pressing process, wherein the packaging body 714 embeds at least a part of the lower surface of the circuit board 711, the lower surface and side surface of the photosensitive chip 712, and at least one electronic component 713 disposed on the lower surface of the circuit board 711.

Figure 9:
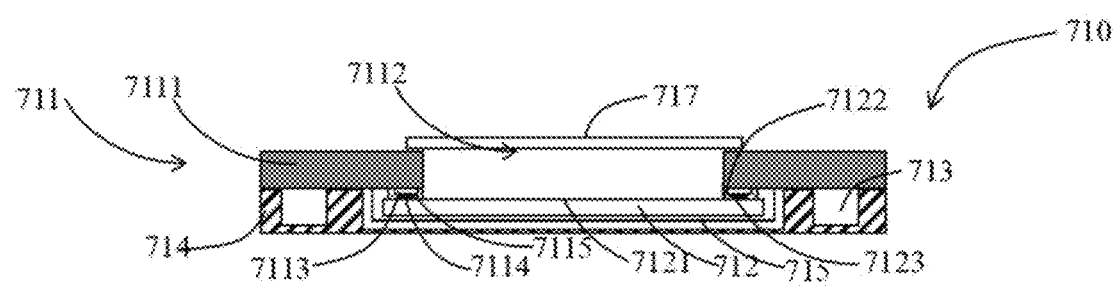
FIG. 9 is a schematic diagram illustrating yet another modified implementation of the photosensitive assembly according to an example of the present application.

Further, in order to achieve better electromagnetic shielding and prevent the photosensitive chip 712 from being interfered during the working process, in another modified implementation of the photosensitive assembly 710 according to an example of the present application as shown in FIG. 9, the photosensitive assembly 710 further includes: a shielding case 715 disposed on the lower surface of the circuit board 711, and the shielding case 715 covers the photosensitive chip 712 therein. As shown in FIG. 9, in an example of the present application, the size of the shielding case 715 is slightly larger than that of the photosensitive chip 712, so that after being disposed on the lower surface of the circuit board 711, the shielding case 715 completely accommodates the photosensitive chip 712 in the receiving cavity 7118 defined by itself, thereby preventing the photosensitive chip 712 from being interfered during the working process. It is worth mentioning that, in a particular implementation, the shielding case 715 may be bonded to the lower surface of the circuit board 711 by soldering, gluing, or the like.

Further, as shown in FIG. 9, in this modified implementation, the photosensitive assembly 710 further includes a packaging body 714, wherein the packaging body 714 is integrally formed on the lower surface of the circuit board 711 and embeds at least a part of the lower surface of the circuit board 711, the shielding case 715, and at least a part of at least one electronic component 713 disposed on the lower surface of the circuit board 711. In a particular implementation, the packaging body 714 may be integrally formed on the lower surface of the circuit board 711 by a molding process or a mold pressing process, wherein the packaging body 714 embeds at least a part of the lower surface of the circuit board 711, the outer surface of the shielding case 715, and at least one electronic component 713 disposed on the lower surface of the circuit board 711. It is particularly worth mentioning that, during the process of forming the packaging body 714 through the molding process or the mold pressing process, the shielding case 715 may effectively prevent the molding material or the mold pressing material from penetrating into the photosensitive area 7121 of the photosensitive chip 712, causing pollution to the photosensitive chip 712; at the same time, the shielding case 715 may also protect the photosensitive chip 712 from being directly contacted and/or impacted by the packaging material during the process of back surface packaging, or protect the photosensitive chip 712 from being directly affected by the pressing force from the mold, which has the function of protecting the photosensitive chip 712 from deformation, cracking and displacement.

Figure 10:
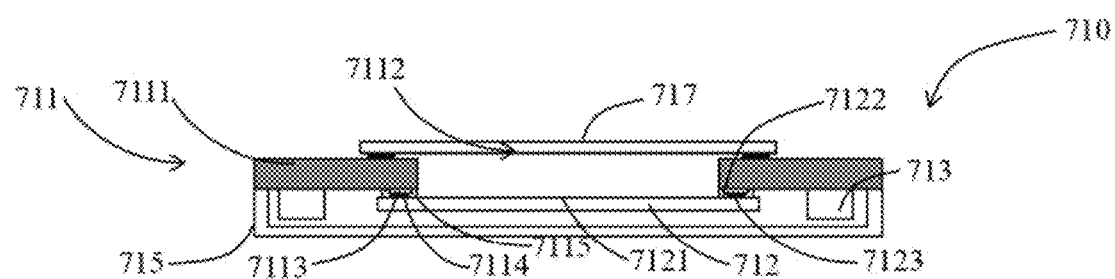
FIG. 10 is a schematic diagram illustrating yet another modified implementation of the photosensitive assembly according to an example of the present application.

It is worth mentioning that, in other examples of the present application, the shielding case 715 may also be disposed on the lower surface of the circuit board 711 in other ways. For example, in another modified implementation of the photosensitive assembly 710 according to an example of the application as shown in FIG. 10, the size of the shielding case 715 corresponds to the size of the lower surface of the circuit board 711, wherein the shielding case 715 is mounted on the edge area of the circuit board 711 to cover the photosensitive chip 712 and the at least one electronic component 713 disposed on the lower surface of the circuit board 711. It should be particularly noted that in this modified implementation, the photosensitive assembly 710 is not provided with the packaging body 714, since the shielding case 715 per se may realize the function of the packaging body 714. That is to say, in an example of the present application, the shielding case 715 may not only create a good electromagnetic shielding environment for the photosensitive chip 712, but also may protect the lower surface of the circuit board 711, the photosensitive chip 712 mounted and electrically connected to the lower surface of the circuit board 711, and at least one electronic component 713 disposed on the lower surface of the circuit board 711.

Figure 11:
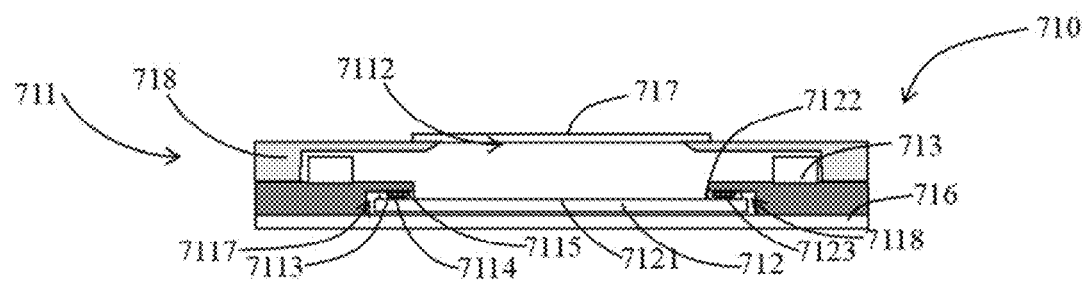
FIG. 11 is a schematic diagram illustrating yet another modified implementation of the photosensitive assembly according to an example of the present application.

FIG. 11 is a schematic diagram illustrating yet another modified implementation of the photosensitive assembly 710 according to an example of the present application. As shown in FIG. 11, when the photosensitive chip 712 is mounted on the lower surface of the circuit board 711 in the manner as shown in FIG. 6 or FIG. 8, and the at least one electronic component 713 is disposed on the upper surface of the circuit board 711, the photosensitive assembly 710 further includes a reinforcing plate 716 disposed on the lower surface of the circuit board 711. It should be noted that, in this modified example, the photosensitive assembly 710 is not provided with the shielding case 715 and the packaging body 714, the reason is that: when the reinforcing plate 716 is mounted on the lower surface of the circuit board 711, the reinforcing plate 716 seals the receiving cavity 7118 formed by the groove 7117 of the circuit board main body 7111 and the through hole 7112, so as to seal the photosensitive chip 712 in the receiving cavity 7118, thereby creating a good, enclosed electromagnetic environment for the photosensitive chip 712. Meanwhile, the reinforcing plate 716 mounted on the lower surface of the circuit board 711 may effectively protect the lower surface of the circuit board 711. In a particular implementation, the reinforcing plate 716 is preferably implemented as a metal plate, so as to enhance the effect of heat dissipation. Of course, in other examples of the present application, the reinforcing plate 716 may also be implemented as a plate of other materials, such as ceramics; in this regard, it is not limited by the present application.

Further, as shown in FIG. 2, in an example of the present application, the photosensitive assembly 710 further includes a filter element 717 disposed on the upper surface of the circuit board 711 and corresponding to the through hole 7112, wherein the function of the filter element 717 is to filter the light entering the photosensitive chip 712. It should be noted that in an example of the present application, the filter element 717 is directly disposed on the upper surface of the circuit board 711, i.e., in an example of the present application, the photosensitive assembly 710 is not provided with a conventional bracket structure, thereby reducing the overall height of the photosensitive assembly 710 and/or the camera module.

Those skilled in the art will appreciate that, the filter element 717 may be implemented as different types, including but not limited to, the filter element 717 may be implemented as an infrared cut filter, a fully transparent spectral filter, and other filters or a combination of multiple filters. Particularly, for example, when the filter element 717 is implemented as a combination of an infrared cut-off filter and a fully transparent spectral filter, i.e., the infrared cut-off filter and the fully transparent spectral filter may be switched to be selectively located on the photosensitive path of the photosensitive chip 712, so that the infrared cut-off filter may be switched to the photosensitive path of the photosensitive chip 712 when it is used in an environment with sufficient light such as during the day, thereby filtering the infrared rays in the light which is reflected by the object and enters into the photosensitive chip 712 by the infrared cut-off filter; in addition, when it is used in a dark environment such as night, the fully transparent spectral filter may be switched to the photosensitive path of the photosensitive chip 712, thereby allowing the infrared part of the light which is reflected by the object and enters into the photosensitive chip 712 to pass through the filter.

Figure 12:
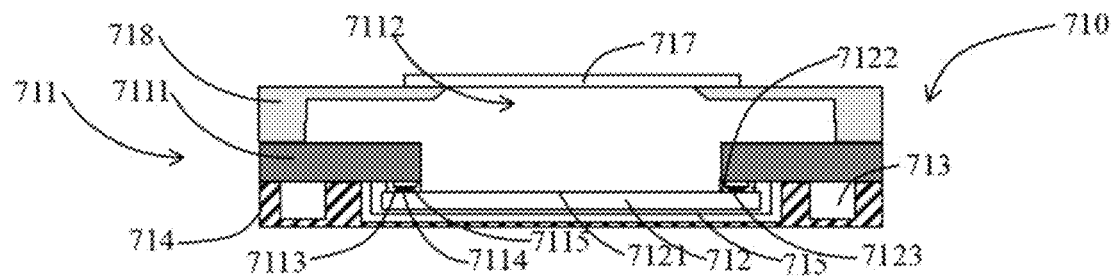
FIG. 12 is a schematic diagram illustrating yet another modified implementation of the photosensitive assembly according to an example of the present application.

FIG. 12 is a schematic diagram illustrating yet another modified implementation of the photosensitive assembly 710 according to an example of the present application. As shown in FIG. 12, in this modified implementation, the photosensitive assembly 710 further includes a filter element bracket 718 disposed on the upper surface of the circuit board 711, wherein the filter element 717 is mounted on the upper surface of the filter element bracket 718. Of course, those of ordinary skill in the art should understand that, in other examples of the present application, the filter element 717 may also be disposed at other positions of the camera module (for example, on the top side of the optical lens 720); in this regard, it is not limited by this application.

Further, as shown in FIG. 2, in an example of the present application, the optical lens 720 is directly disposed on the upper surface of the circuit board 711, so that the overall height of the photosensitive assembly 710 and/or the camera module is further reduced. Those of ordinary skill in the art should know that in most of the existing camera modules, the optical lens 720 is mounted on the lens bracket. In an example of the present application, the reason why the optical lens 720 may be directly mounted on the upper surface of the circuit board 711 is that: the photosensitive chip 712 is disposed on the back side of the circuit board 711, and such a structural configuration may increase the optical back focal length of the camera module. It is worth mentioning that, in an example of the present application, the optical lens 720 may be implemented as an integral lens or a split lens (assembled from a plurality of lens parts); in this regard, it is not limited by the present application.

Figure 13:
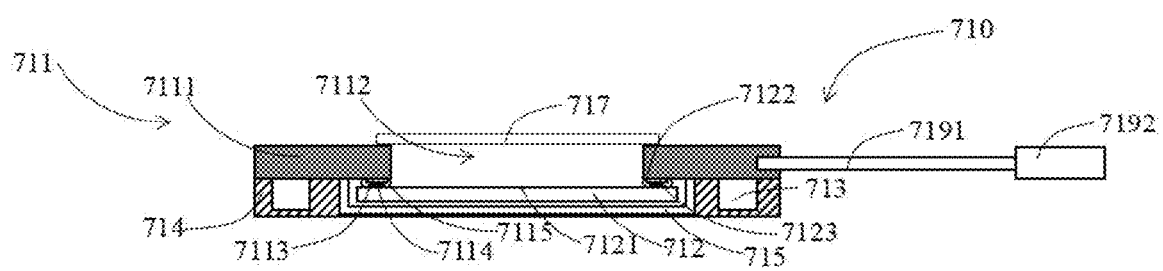
FIG. 13 is a schematic diagram illustrating yet another modified implementation of the photosensitive assembly according to an example of the present application.
Figure 14:
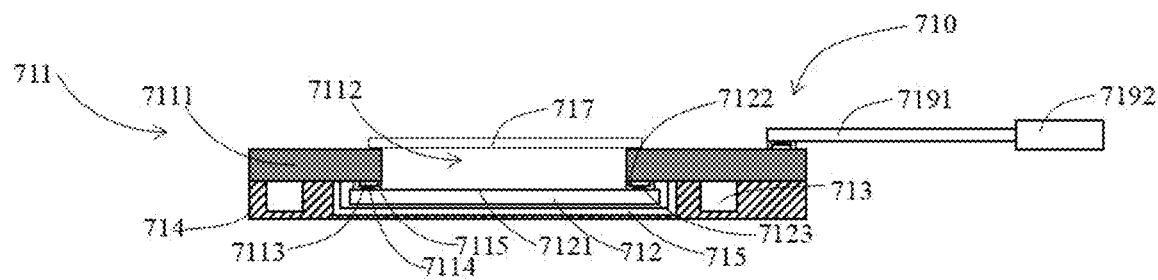
FIG. 14 is a schematic diagram illustrating yet another modified implementation of the photosensitive assembly according to an example of the present application.
Figure 15:
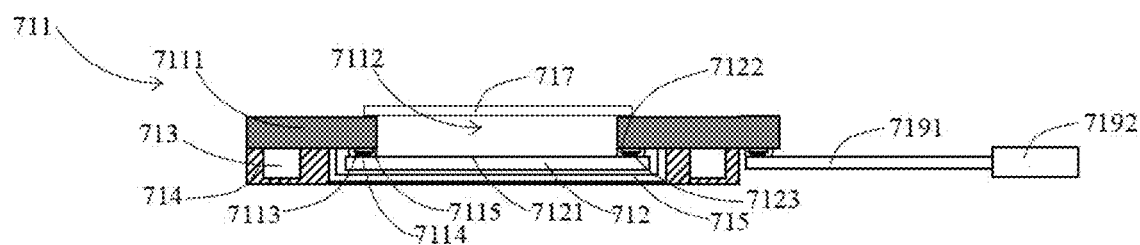
FIG. 15 is a schematic diagram illustrating yet another modified implementation of the photosensitive assembly according to an example of the present application.

FIG. 13 is a schematic diagram illustrating yet another modified implementation of the photosensitive assembly 710 according to an example of the present application. As shown in FIG. 13, in this modified example, the photosensitive assembly 710 further includes a flexible board connecting plate 7191 electrically connected to the circuit board 711 and an electrical connector 7192 electrically connected to the flexible board connecting plate 7191, so as to realize the electrical connection between the camera module and/or the photosensitive assembly 710 and the external device through the electrical connector 7192. In particular, in this modified implementation, the flexible board connecting plate 7191 is integrally combined with the circuit board 711. Particularly, as shown in FIG. 13, in this modified implementation, the flexible board connecting plate 7191 is embedded into the circuit board main body 7111 (e.g., in the middle position) to be integrated with the circuit board 711. Of course, those skilled in the art should understand that in other examples of the present application, the flexible board connecting plate 7191 may also be combined with the circuit board 711 in other ways, for example, in another modified implementation of the photosensitive assembly 710 as shown in FIG. 14, the flexible board connecting plate 7191 is mounted and electrically connected to the upper surface of the circuit board 711 through a conducting medium 7114 and a non-conducting adhesive 7115; for another example, in another modified implementation of the photosensitive assembly 710 as shown in FIG. 15, the flexible board connecting plate 7191 is mounted and electrically connected to the lower surface of the circuit board 711; in this regard, it is not limited by this application.

To sum up, the camera module and the photosensitive assembly 710 thereof according to the examples of the present application have been explained, which have at least the following advantages.

Firstly, in an example of the present application, the photosensitive chip 712 in the photosensitive assembly 710 is electrically connected to the circuit board 711 by directly contacting the conducting medium 7114 disposed on the circuit board 711. In this way, the current configuration in which the photosensitive chip 712 and the circuit board 711 are electrically connected by wires is cancelled, so as to shorten the conduction distance, enhance the conductivity and signal transmission ability, and reduce the loss of the signal during the transmission process.

Secondly, in an example of the present application, the photosensitive chip 712 is electrically connected to the circuit board 711 by being pressed against the conducting medium 7114 disposed on the circuit board 711, and the photosensitive chip 712 is bonded to the circuit board 711 through the non-conducting adhesive 7115 disposed on the conducting medium 7114, thereby ensuring the stability of the electrical connection between the photosensitive chip 712 and the circuit board 711. That is to say, compared with the existing FC process, in an example of the present application, the photosensitive chip 712 realizes stable electrical connection between the photosensitive chip 712 and the circuit board 711 with relatively low cost and relatively low process difficulty.

Thirdly, in an example of the present application, during the process of electrically connecting the photosensitive chip 712 to the circuit board 711, the photosensitive assembly 710 is at a relatively low temperature (about 80° to 150°). That is to say, in an implementation of the present application, the process of electrically connecting the photosensitive chip 712 to the circuit board 711 is performed at a relatively low temperature, so as to reduce the difficulty of the process on one hand, and on the other hand to reduce the amount of expansion and contraction of the non-conducting adhesive 7115 disposed between the photosensitive chip 712 and the circuit board 711, thereby reducing the deformability of the non-conducting adhesive 7115 to the photosensitive chip 712.

Fourthly, in an example of the present application, the photosensitive chip 712 is disposed on the lower surface of the circuit board 711, and in an example of the present application, the filter element 717 may be directly disposed on the upper surface of the circuit board 711. That is to say, in an example of the present application, the photosensitive assembly 710 is not provided with a traditional bracket structure, so that the overall height of the photosensitive assembly 710 and/or the camera module may be reduced.

Fifthly, in an example of the present application, the photosensitive chip 712 is disposed on the back side of the circuit board 711, and such a structural configuration may increase the optical back focal length of the camera module, so that it is still guaranteed that the camera module may be configured with an optical lens having a longer focal length, under the premise that the thickness of the camera module is reduced.

Although, the above camera module is exemplarily implemented as a fixed-focus camera module, those skilled in the art should know that the camera module referred in the present application may also be implemented as a moving-focus camera module, i.e., the camera module further includes a driving element (not shown) disposed between the optical lens 720 and the photosensitive assembly 710, so as to carry the optical lens to move along the photosensitive path via the driving element, thereby changing the distance between the optical lens and the photosensitive assembly 710. Of course, the camera module referred in the present application may also be implemented as an optical anti-shake camera module, i.e., the camera module further includes an anti-shake motor (not shown) disposed between the optical lens 720 and the photosensitive assembly 710, thereby eliminating the influence of inadvertent shake during the shooting process on the image quality via the anti-shake motor; in this regard, it is not limited by this application.

Exemplary Manufacturing Process of the Photosensitive Assembly

Figure 16A:
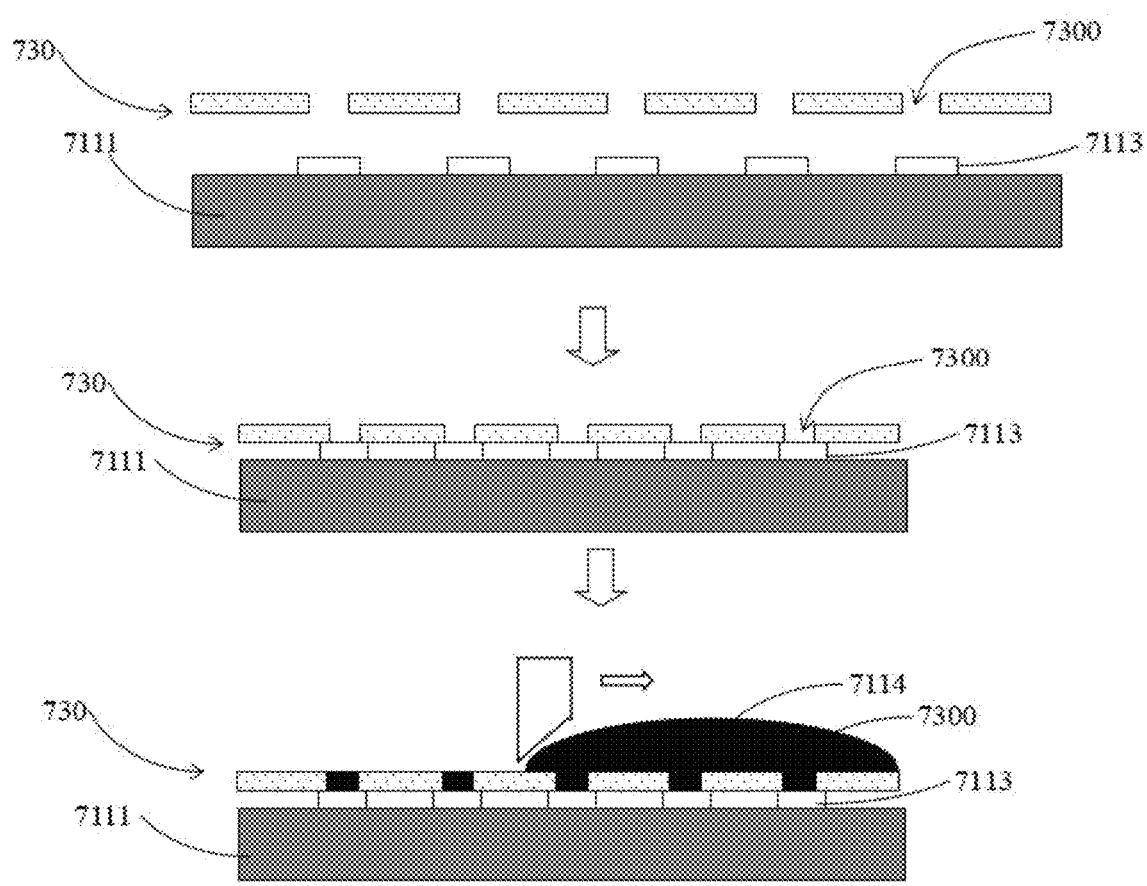
FIGS. 16A-16C are schematic diagrams illustrating a manufacturing process according to an example of the present application.
Figure 16B:
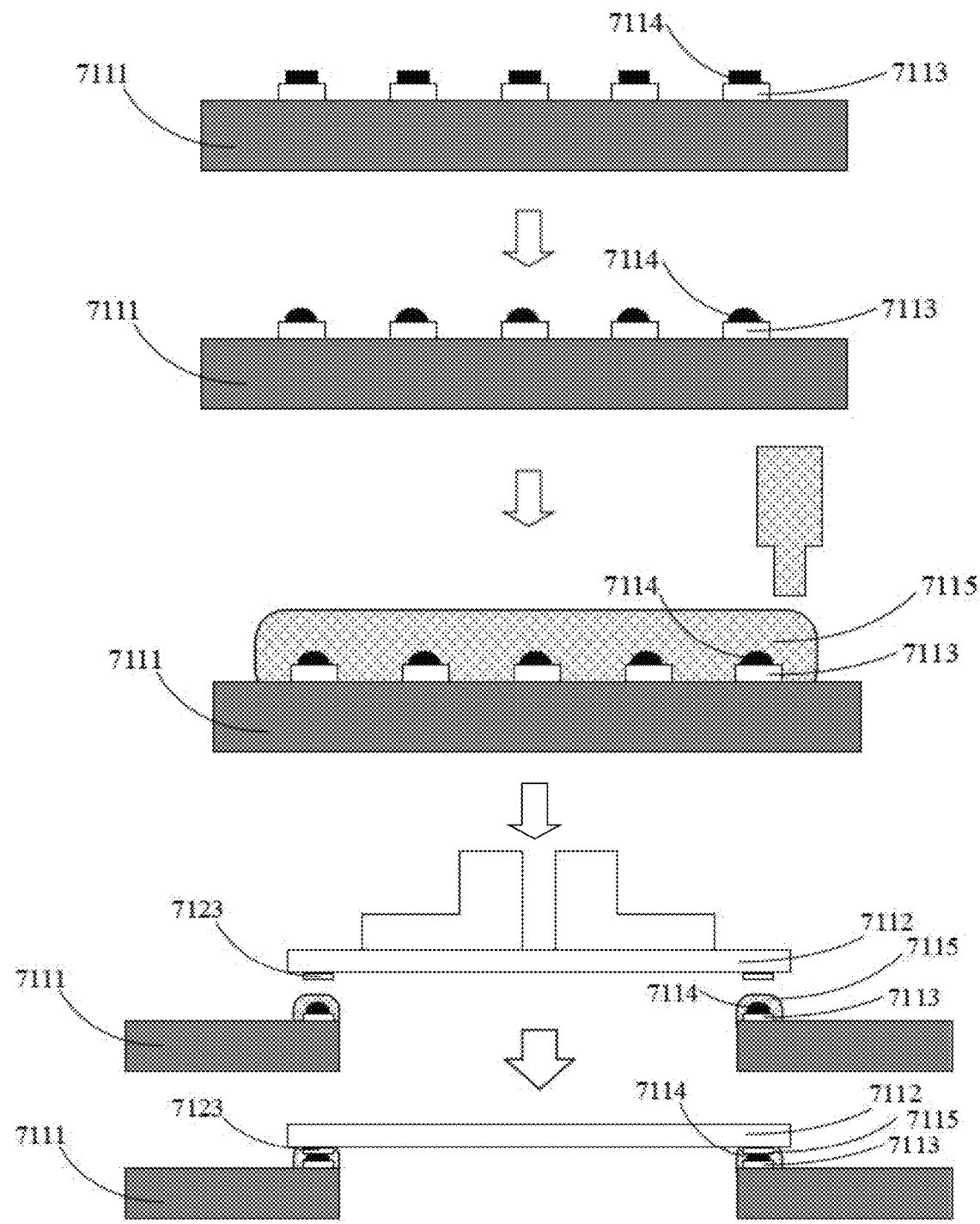
Figure 16C:
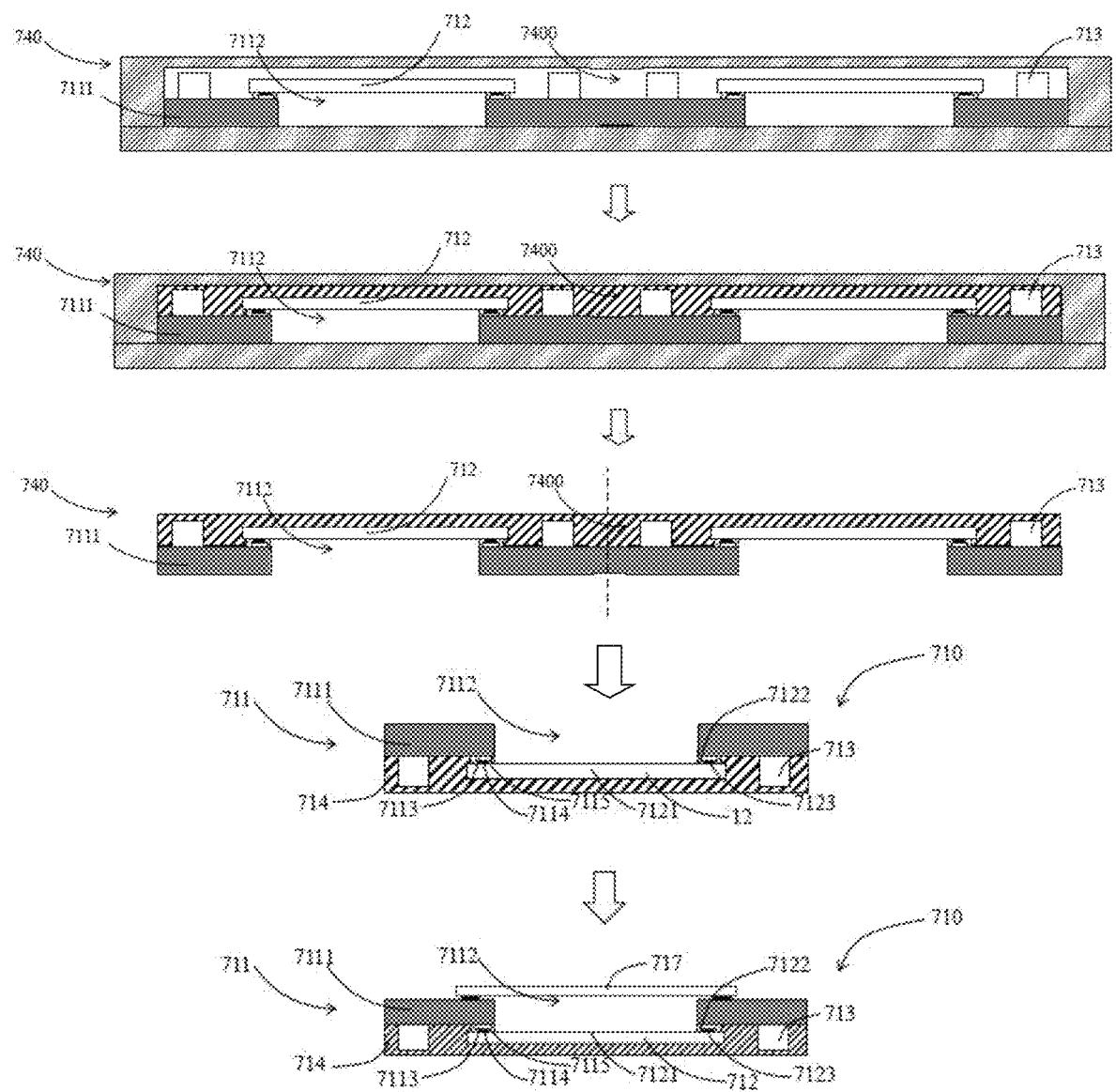

As shown in FIGS. 16A-16C, a manufacturing process of the photosensitive assembly 710 according to an example of the present application is illustrated. And the manufacturing process as shown in FIGS. 16A-16C is taken as an example of manufacturing the photosensitive assembly 710 as shown in FIG. 2.

Particularly, as shown in FIG. 16A, in the manufacturing process, firstly a circuit board 711 and a photosensitive chip 712 are provided. The circuit board 711 includes a circuit board main body 7111, a through hole 7112 formed through the circuit board main body 7111, and a set of circuit board electrical connecting terminals 7113 disposed on a lower surface of the circuit board main body 7111. An upper surface of the photosensitive chip 712 includes a photosensitive area 7121, a non-photosensitive area 7121 located around the photosensitive area 7121, and a chip electrical connecting terminal 7122 disposed in the non-photosensitive area 7121.

Further, as shown in FIG. 16, a conducting medium 7114 is formed on the electrical connecting terminals 7113 of the circuit board 711, respectively.

Particularly, in this exemplary manufacturing process, forming a conducting medium 7114 on the circuit board electrical connecting terminal 7113 includes:

firstly, providing a layer of mask 730 or a printing plate on the lower surface of the circuit board 711, wherein the mask 730 has a series of openings 7300 passing through it and corresponding to the circuit board electrical connecting terminals 7113 respectively; and applying excess conducting medium 7114 on the mask 730; then removing the redundant conducting medium 7114 from the surface of the mask 730; and then, removing the mask 730 to form the conducting medium 7114 at positions corresponding to the openings 7300. In particular, in this exemplary manufacturing process, the size of the opening 7300 is smaller than that of the circuit board electrical connecting terminal 7113, so that the mask 730 is removed to form the conducting medium 7114 at the corresponding position of the opening 7300, wherein the conducting medium has the following properties: the size of the conducting medium 7114 is smaller than that of the circuit board electrical connecting terminal 7113, and the conducting medium 7114 covers a part of the circuit board electrical connecting terminal 7113. Of course, those skilled in the art should understand that, corresponding to other modified implementations of the photosensitive assembly 710 according to an examples of the present application, in other manufacturing processes, the size of the opening 7300 of the mask 730 may correspond to that of the circuit board electrical connecting terminal 7113, so that the mask 730 is removed to form the conducting medium 7114 at the corresponding position of the opening 7300, wherein the conducting medium has the following properties: the size of the conducting medium 7114 is equal to that of the circuit board electrical connecting terminal 7113, and the conducting medium 7114 completely covers the circuit board electrical connecting terminal 7113. Alternatively, the size of the opening 7300 of the mask 730 may be larger than that of the circuit board electrical connecting terminal 7113, so that the mask 730 is removed to form the conducting medium 7114 at the corresponding positions of the opening 7300, wherein the conducting medium has the following properties: the size of the conducting medium 7114 is larger than that of the circuit board electrical connecting terminal 7113, and the conducting medium 7114 covers the circuit board electrical connecting terminal 7113 therein.

It is worth mentioning that, after removing the mask 730 to form the conducting medium 7114 at the corresponding position of the opening 7300, the conducting medium 7114 will become a conductive round convex shape with a structure of small upper part and big lower part due to the effect of gravity, and its upper surface is a cambered surface. Further, the conducting medium 7114 may be pre-cured by heating, so as to be fixed on the circuit board electrical connecting terminal 7113.

Further, as shown in FIG. 16B, a non-conducting adhesive 7115 is applied on the conducting medium 7114.

Further, as shown in FIG. 16B, the chip electrical connecting terminal 7122 is pressed against on the conducting medium 7114 to electrically connect the chip electrical connecting terminal 7122 and the circuit board electrical connecting terminal 7113, and the photosensitive chip 712 is bonded to the lower surface of the circuit board 711 via a non-conductive adhesive 7115; and in this way, the photosensitive chip 712 is electrically connected to the circuit board 711.

It is worth mentioning that, in an example of the present application, there is a special relationship between the properties of the conducting medium 7114 and the non-conducting adhesive 7115. Particularly, the conducting medium 7114 and the non-conducting adhesive 7115 are configured to have the following properties: during the process of electrically connecting the photosensitive chip 712 to the circuit board 711, the photosensitive assembly 710 is heated to a specific temperature range, wherein the conducting medium 7114 has deformable property within the specific temperature range, and at the same time, the non-conducting adhesive 7115 is cured in this specific temperature range. Correspondingly, during the process of pressing the chip electrical connecting terminal 7122 against the conducting medium 7114 to electrically connect the chip electrical connecting terminal 7122 to the circuit board electrical connecting terminal 7113, and to bond the photosensitive chip 712 to the lower surface of the circuit board 711 via the non-conducting adhesive 7115, the photosensitive chip 712 and the circuit board 711 are heated to 80° C.-150° C.; wherein the conducting medium 7114 has deformable property and at the same time the non-conducting adhesive 7115 is cured in this specific temperature range.

Particularly, during the process of pressing the chip electrical connecting terminal 7122 against the conducting medium 7114 to electrically connect the chip electrical connecting terminal 7122 to the circuit board electrical connecting terminal 7113, and to bond the photosensitive chip 712 to the lower surface of the circuit board 711 via the non-conducting adhesive 7115, firstly, the photosensitive chip 712 is brought close to the circuit board 711, so that the chip electrical connecting terminal 7122 of the photosensitive chip 712 corresponds to the circuit board electrical connecting terminal 7113 of the circuit board 711; further, the distance between the photosensitive chip 712 and the circuit board 711 is gradually shortened (for example, the photosensitive chip 712 is pressed down), so that the chip electrical connecting terminal 7122 of the photosensitive chip 712 passes through the incompletely cured non-conducting adhesive 7115 to contact the conducting medium 7114, thereby realizing the electrical connection between the photosensitive chip 712 and the circuit board 711; secondly, the distance between the photosensitive chip 712 and the circuit board 711 is continuously shortened (for example, continuing to press down the photosensitive chip 712), so that the chip electrical connecting terminal 7122 of the photosensitive chip 712 presses on the conducting medium 7114 to make the conducting medium 7114 deformed, thereby improving the stability of the electrical connection between the photosensitive chip 712 and the circuit board 711. At the same time, in such a specific process environment temperature, the non-conducting adhesive 7115 will also be gradually cured, so that during the process of electrically connecting the photosensitive chip 712 to the lower surface of the circuit board 711, the photosensitive chip 712 is also firmly attached to the lower surface of the circuit board 711 via the non-conducting adhesive 7115. In this way, on one hand, the stability of electrical connection between the photosensitive chip 712 and the circuit board 711 may be ensured; on the other hand, the bonding strength between the photosensitive chip 712 and the circuit board 711 may also be effectively ensured. That is to say, in an example of the present application, the photosensitive chip 712 is electrically connected to the lower surface of the circuit board 711, and the photosensitive chip 712 is bonded to the lower surface of the circuit board 711 almost simultaneously, so that the physical bonding between the photosensitive chip 712 and the circuit board 711 via the non-conducting adhesive 7115 may ensure the stability of the electrical connection between the photosensitive chip 712 and the circuit board 711.

It is worth mentioning that, in order to enhance the electrical conductivity between the photosensitive chip 712 and the circuit board 711, in other manufacturing processes of the present application, a conductive film 7116 may also be formed on the surface of the conducting medium 7114, for example, by means of chemical coating or electroplating.

In order to protect the exposed lower surface of the circuit board 711 and the photosensitive chip 712, as shown in FIG. 16C, the exemplary manufacturing process further includes: integrally forming a packaging body 714 on the lower surface of the circuit board 711, wherein the packaging body 714 embeds at least a part of the lower surface of the circuit board 711, the photosensitive chip 712, and at least a part of at least one electronic component 713 disposed on the lower surface of the circuit board 711. In a particular implementation, the component formed by the circuit board 711, the photosensitive assembly 710 and the at least one electronic component 713 is placed in a molding cavity 7400 of a molding die 740, and then the molding cavity 7400 is filled with molding material, after the molding material is cured and molded, the packaging body 714 is formed on the corresponding position of the lower surface of the circuit board 711.

In order to achieve better electromagnetic shielding and prevent the photosensitive chip 712 from being interfered during the working process, in other exemplary manufacturing processes of the present application, before the packaging body 714 is formed on the lower surface of the circuit board 711 through a molding process, it further includes: disposing a shielding case 715 on the lower surface of the circuit board 711, wherein the shielding case 715 covers the photosensitive chip 712 therein. Further, a packaging body 714 is integrally formed on the lower surface of the circuit board 711, wherein the packaging body 714 is integrally formed on the lower surface of the circuit board 711 and embeds at least a part of the lower surface of the circuit board 711, the shielding case 715, and at least a part of at least one electronic component 713 disposed on the lower surface of the circuit board 711.

It is worth mentioning that, since a closed chamber is formed by the shielding case 715 and the photosensitive chip 712, when the packaging body 714 is formed by the molding process, the gas in the closed chamber will expand, thereby squeezing the photosensitive chip 712 to make it deformed; therefore, an air escape channel may be disposed on the circuit board 711 to pass through it and communicate with the airtight chamber. Of course, after the packaging body 714 is formed, the air escape channel needs to be resealed.

Those skilled in the art should understand that, when the size of the shielding case 715 corresponds to that of the lower surface of the circuit board 711, the shielding case 715 may be mounted on the edge area of the circuit board 711 to cover the photosensitive chip 712 and at least one electronic component 713 disposed on the lower surface of the circuit board 711. In this case, the photosensitive assembly 710 may not need to be provided with the packaging body 714. Corresponding to this modified implementation, in other exemplary manufacturing processes of the present application, the shielding case 715 may be disposed on the lower surface of the circuit board 711, wherein the shielding case 715 covers the photosensitive chip 712 and the lower surface of the circuit board 711 therein.

Likewise, those of ordinary skill in the art should understand that, when the photosensitive assembly 710 is implemented as a modified implementation as shown in FIG. 11, corresponding to this implementation, the manufacturing process further includes: mounting a reinforcing plate 716 on the lower surface of the circuit board 711, wherein the reinforcing plate 716 covers at least a part of the lower surface of the circuit board 711 and the photosensitive chip 712.

Further, in the exemplary manufacturing process according to the present application, it further includes: disposing a filter element 717 on the upper surface of the circuit board 711, wherein the filter element 717 corresponds to the through hole 7112 of the circuit board 711.

It should be noted that in the exemplary manufacturing process described above, firstly the photosensitive chip 712 is mounted and electrically connected to the lower surface of the circuit board 711, and then the filter element 717 is mounted on the upper surface of the circuit board 711, before the filter element 717 is mounted, the photosensitive area 7121 of the photosensitive chip 712 of the photosensitive chip 712 is exposed, and no effective isolation measures are provided, thus the photosensitive area 7121 may be contaminated by dirty substance such as dust, or scratched by sharp objects. Therefore, in order to protect the photosensitive area 7121 of the photosensitive chip 712, during the process of mounting and electrically connecting the photosensitive chip 712 to the lower surface of the circuit board 711, an isolation layer (e.g., an adhesive layer) may be applied on at least the photosensitive area 7121 of the photosensitive chip 712 in advance, thereby preventing the photosensitive chip 712 from being contaminated or scratched. Correspondingly, after forming the packaging body 714, or disposing the reinforcing plate 716 on the lower surface of the circuit board 711, or disposing the shielding case 715 on the edge of the lower surface of the circuit board 711, the isolation layer (for example, when the isolation layer is an adhesive layer, the isolation layer may be removed by washing with water or dissolving with an organic solvent) is removed, and then the filter element 717 is mounted again.

Of course, in other exemplary manufacturing processes of the present application, firstly the filter element 717 may also be mounted on the upper surface of the circuit board 711 optionally, so that when the photosensitive chip 712 is attached and electrically connected to the lower surface of the circuit board 711 through the above-mentioned manufacturing process, the photosensitive area 7121 of the photosensitive chip 712 is located in a closed chamber surrounded by the filter element 717, the circuit board 711 and the photosensitive chip 712, thereby preventing the photosensitive chip 712 from being contaminated or scratched.

Figure 17A:
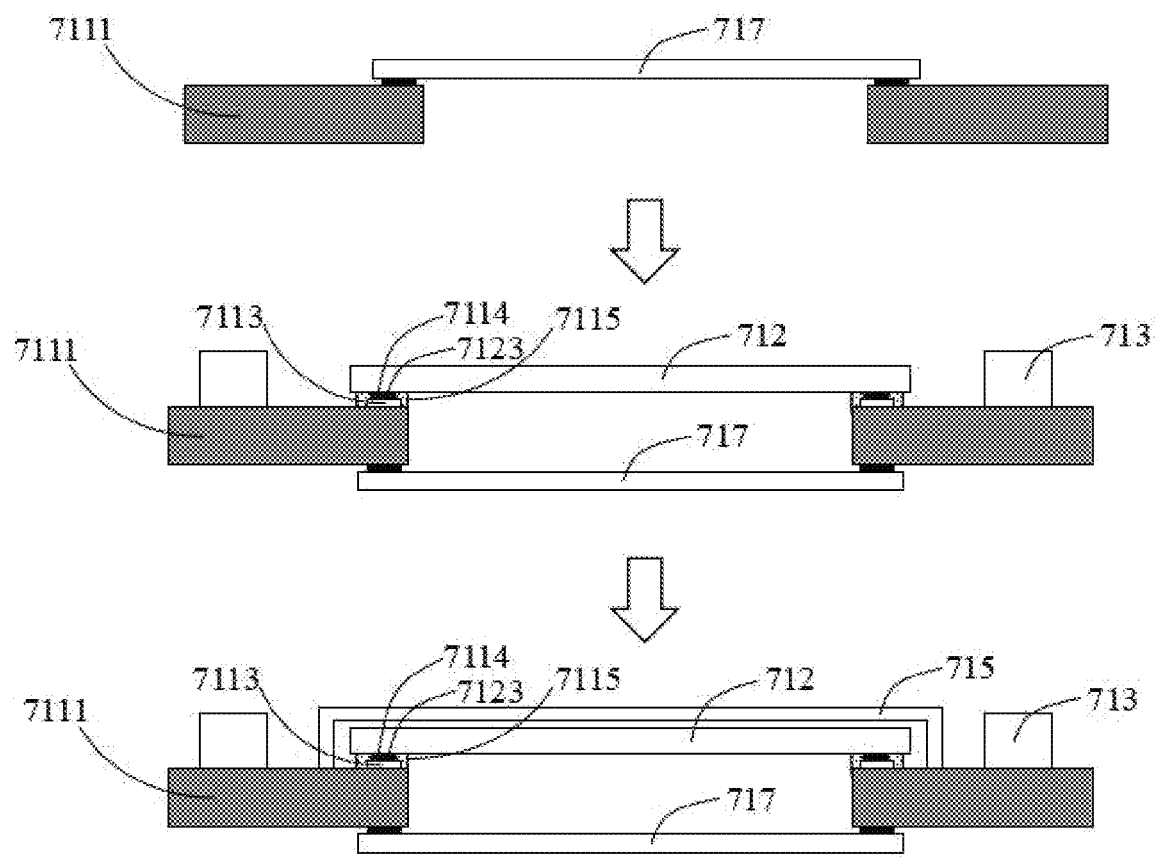
FIGS. 17A and 17B are schematic diagrams illustrating another manufacturing process according to an example of the present application.
Figure 17B:
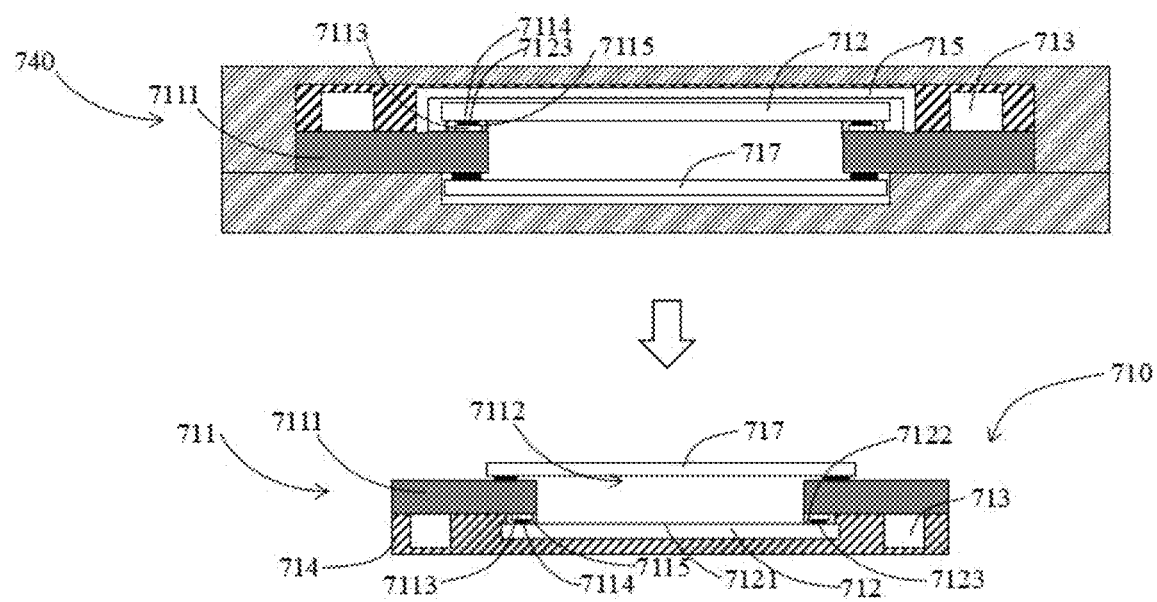

Particularly, such an exemplary process is illustrated in FIGS. 17A-17B. As shown in FIGS. 17A-17B, firstly the filter element 717 is mounted on the upper surface of the circuit board 711; secondly the photosensitive chip 712 is mounted and electrically connected to the lower surface of the circuit board 711 through the manufacturing process mentioned above, so that the photosensitive area 7121 of the photosensitive chip 712 is located in an airtight chamber surrounded by the filter element 717, the circuit board 711 and the photosensitive chip 712, thereby preventing the photosensitive chip 712 from being contaminated or scratched; then the shielding case 715 is mounted on the lower surface of the circuit board 711; finally the molded body is formed on the lower surface of the circuit board 711 through a molding process.

It is worth mentioning that, in order to improve the preparation efficiency, in the manufacturing processes disclosed in the present application, the photosensitive assembly 710 may be prepared in a manner of jointed panel manufacturing, i.e., the circuit board 711 is implemented as a jointed panel of the circuit board 711, and includes at least two monomers of the circuit board 711. In order to further improve the preparation efficiency, before the jointed panel preparation, the flexible board connecting plate 7191 and the electrical connector 7192 may also be pre-configured on the circuit board 711; in this regard, it should be easily understood by those of ordinary skill in the art.

To sum up, the manufacturing process of the photosensitive assembly 710 according to the examples of the present application has been illustrated, by which the photosensitive assembly 710 and its modified examples may be prepared as described above.

Overview of Further Improvement

As mentioned above, at present, the electrical connection between the hard board and the flexible board in the circuit board of the camera module is realized by ACF (Anisotropic Conductive Film). However, limited by the properties of ACF and the conduction process, the electrical connecting structure formed by the hard board and the flexible board has certain defects, such as uncontrollable electrical conduction performance, high process temperature, and excessive pressing force.

Figure 18:
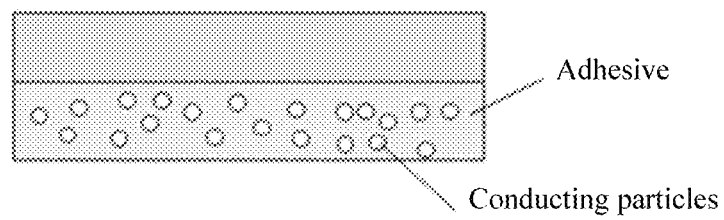
FIG. 18 is a schematic diagram illustrating the structure of a conventional ACF.
Figure 19:
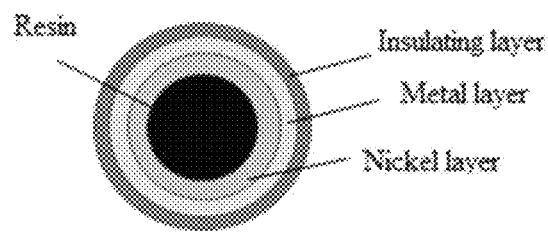
FIG. 19 is a schematic diagram illustrating conductive particles in a conventional ACF.
Figure 20:
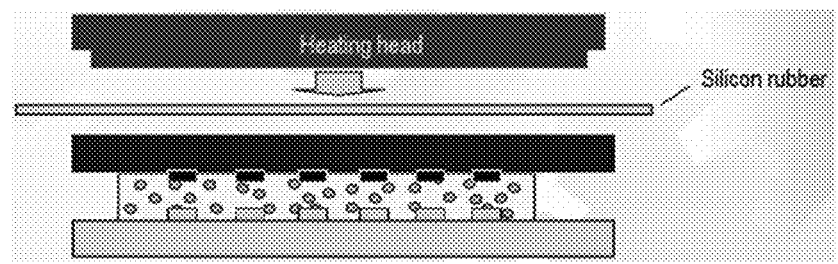
FIG. 20 is a schematic diagram illustrating the process of realizing an electrical connection between a hard board and a flexible board through the ACF.

More particularly, FIG. 18 is a schematic diagram illustrating the structure of a conventional ACF. As shown in FIG. 18, ACF mainly includes resin adhesive and conductive particles, and its conduction principle is: electrically connecting the electrical connecting terminals of the hard board and the flexible board via conductive particles, and at the same time avoiding the short circuit of the adjacent electrical connecting terminals, thereby achieving the purpose of conduction only in the Z-axis direction. That is to say, ACF may realize that the resistance characteristics of the Z-axis electrical conduction direction and the XY insulation plane are significantly different; when the difference between the conducting resistance value in the Z-axis direction and the insulating resistance value of the XY plane exceeds a certain ratio, it may be called good conductivity and anisotropy. Those of ordinary skill in the art should know that, the anisotropic conductive properties mainly depend on the filling rate of the conductive particles. Although the conductivity of ACF will be increased with the increase of the filling rate of conductive particles, at the same time, the probability of short circuit caused by contacting each other between the conductive particles will also be increased. In addition, the particle size distribution and distribution uniformity of the conductive particles will also affect the anisotropic conductive properties. Generally, conductive particles must have good particle size uniformity and roundness to ensure consistent contact area between electrodes and conductive particles, thereby maintaining the same conducting resistance, and at the same time avoiding some electrodes not contacting conductive particles to result in an open circuit. The common particle size range is 3-5 μm, too large conductive particles will reduce the number of particles in contact with each electrode, and at the same time, it is easy to cause contact between the conductive particles of adjacent electrodes and result in short circuit; too small conductive particles are easy to cause the problem of particle aggregation and result in uneven particle distribution density. At present, the conductive particles are mainly metal powders and polymer plastic ball coated with metal. Commonly used metal powders include nickel (Ni), gold (Au), gold plating on nickel, silver and tin alloy.

In the non-usage state, the conductive particles in the ACF are uniformly distributed in the binder and do not contact each other, i.e., the ACF film is non-conducting in the non-usage state. During the process of electrically conducting the hard board and the flexible board through the ACF, as shown in 20, firstly the ACF film is pressurized and heated; typically, the pressurizing and heating are performed in two times, the first time is for pre-positioning with a heating temperature of 60-100° C. and a pressure of $(3-10)\times 10^4$ Pa, and the second time is for fixing with a heating temperature of about 150-200° C. and a pressure of $(20-40)\times 10^4$ Pa. Under such conditions, the insulating film of the conductive particles is ruptured and squeezed together in the part having the circuit to result in conduction.

However, during the process of heating and pressurizing, it is inevitable that a part of the insulating film of the conductive particles in the vertical direction (i.e., the Z-axis direction) is not crushed, which affects the conductive performance in the vertical direction. That is to say, the process of conducting the hard board and the flexible board through ACF has characteristics of being random and uncontrollable.

In addition, under the action of temperature and pressure, the gaps of the upper and lower electrical connecting terminals are filled with fluidity by ACF, similarly the gaps of the upper and lower electrical connecting terminals are filled with fluidity by the conductive particles in the ACF. However, on one hand, it is probabilistic that the conductive particles may flow into the gap, and the accuracy is not very controllable; in the other hand, there are also conductive particles exist between the lateral electrical connecting terminals, excessive or large conductive particles may contact and connect with each other between adjacent lateral electrical connecting terminals during the pressing process, resulting in a short circuit of lateral conduction and abnormal electrical function.

Moreover, the pressing force required in this process is large, and the process is difficult. In addition, the temperature required in this process is high (the temperature of the second heating is about 150-200° C.), and an excessively high temperature will cause a large amount of expansion and contraction of the hard board, resulting in bending of the hard board.

In view of the above technical problems, the basic idea of the present application is to provide an integral connecting structure, which includes a conducting medium and a non-conducting adhesive adjacent to each other, so as to realize the electrical connection between the circuit board main body and the electrical connecting plate through the integral connecting structure.

Based on this, the present application provides a circuit board assembly, which includes a circuit board main body, an electrical connecting plate, and an electrical connector. The circuit board main body has a circuit board electrical connecting terminal disposed on the surface thereof. The electrical connecting plate has a connecting plate electrical connecting terminal disposed on the surface thereof and corresponding to the circuit board electrical connecting terminal. The circuit board assembly further includes an integral connecting structure disposed between the connecting plate electrical connecting terminal and the circuit board electrical connecting terminal. The integral connecting structure includes a conducting medium and a non-conducting adhesive adjacent to each other, wherein the connecting plate electrical connecting terminal is electrically connected to the circuit board electrical connecting terminal via the conducting medium, while the electrical connecting plate is bonded to the circuit board via the non-conducting adhesive. In this way, conduction between the circuit board main body and the electrical connecting plate is achieved through the integral connecting structure and the corresponding electrical conduction process.

After introducing the basic principles of the present application, various non-limiting examples of the present application will be described in detail below with reference to the accompanying drawings.

Exemplary Circuit Board Assembly

Figure 21:
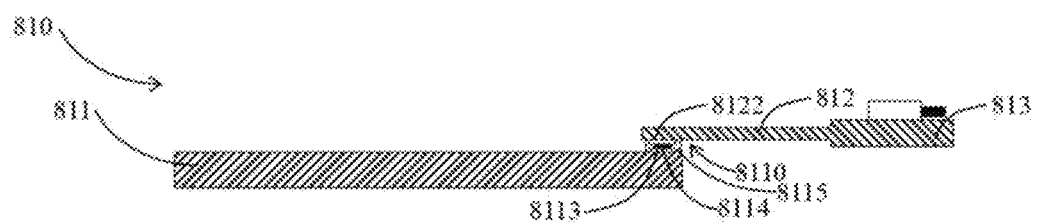
FIG. 21 is a schematic diagram illustrating a circuit board assembly according to an example of the present application.

As shown in FIG. 21, a circuit board assembly 810 according to an example of the present application is illustrated. The circuit board assembly 810 is a circuit board assembly for a camera module, which includes a circuit board main body 811, and the electrical connecting plate 812 electrically connected to the circuit board main body 811, and an electrical connector 813 electrically connected to the electrical connecting plate 812, wherein the electrical connector 813 is used to conduct the camera module and other electrical components. In particular, compared with the existing method of conducting the circuit board main body and the electrical connecting plate through ACF, in an example of the present application, the electrical connecting plate 812 is electrically connected to the circuit board main body 811 through an integral connecting structure 8110.

In an example of the present application, the circuit board main body 811 is generally implemented as a hard board, which includes a set of circuit board electrical connecting terminals 8113 disposed on the surface thereof. The electrical connecting plate 812 is generally implemented as a flexible board, which includes a connecting plate electrical connecting terminal 8122 disposed on the surface thereof, wherein the connecting plate electrical connecting terminals 8122 correspond to the circuit board electrical connecting terminal 8113. In particular, as shown in FIG. 21, in an example of the present application, the integral connecting structure 8110 includes a conducting medium 8114 and a non-conducting adhesive 8115 disposed in a manner of layered structures adjacent to each other, wherein the connecting plate electrical connecting terminal 8122 is electrically connected to the circuit board electrical connecting terminal 8115 via the conducting medium 8114, while the electrical connecting plate 812 is bonded to the circuit board main body via the non-conducting adhesive 8115. In this way, the electrical connection between the electrical connecting plate 812 and the circuit board main body 811 is achieved.

More particularly, as shown in FIG. 4, in a possible implementation manner of the present application, the integral connecting structure 8110 is formed on the circuit board main body 811, wherein the conducting medium 8114 is formed on the circuit board electrical connecting terminal 8113, the non-conducting adhesive 8115 is applied to the conducting medium 8114 to form the integral connecting structure 8110. Correspondingly, the electrical connecting plate 812 is pressed against the integral connecting structure 8110, so that the connecting plate electrical connecting terminal 8113 is electrically connected to the circuit board main body 811 via the conducting medium 8114, while the electrical connecting plate 812 is bonded to the circuit board main body 811 via the non-conducting adhesive 8115. That is to say, in an implementation of the present application, the physical bonding between the circuit board main body 811 and the electrical connecting plate 812, and the electrical connection between the circuit board main body 811 and the electrical connecting plate 812 are synchronized and realized through the integral connecting structure 8110. That is to say, in an example of the present application, the integral connecting structure 8100 is used as a medium for integration, thereby synchronously realizing the electrical connection and the non-electrical connection between the electrical connecting plate 812 and the circuit board 811. Such a process may simultaneously take into account the bonding strength of the electrical connecting plate 812 and the circuit board main body 811, and the stability of the electrical connection between the electrical connecting plate 812 and the circuit board main body 811. It is worth mentioning that, such a process may also be carried out at relatively low temperatures and requires only relatively small pressing force.

More particularly, the key point to the implementation of this process is that: there is a special relationship between the properties of the conducting medium 8114 and the non-conducting adhesive 8115 in the integral connecting structure 8110. Particularly, the conducting medium 8114 and the non-conducting adhesive 8115 are configured to have the following properties: during the process of electrically connecting the electrical connecting plate 812 to the circuit board main body 811, the circuit board assembly 810 is heated to a specific temperature range, wherein the conducting medium 8114 has deformable property in such specific temperature range, and at the same time, the non-conducting adhesive 8115 will be cured in this specific temperature range. Due to the special property relationship between the conducting medium 8114 and the non-conducting adhesive 8115, during the process of electrically connecting the electrical connecting plate 812 to the circuit board main body 811, the connecting plate electrical connecting terminal 8122 of the electrical connecting plate 812 may pass through the non-conducting adhesive 8115 that is not fully cured to be in contact with the conducting medium 8114, and is electrically connected to the circuit board electrical connecting terminal 8113 of the circuit board main body 811 in this way, at the same time the non-conducting adhesive 8115 is also slowly cured, so that after the electrical connecting plate 812 is electrically connected to the lower surface of the circuit board main body 811, the electrical connecting plate 812 is also firmly attached to the lower surface of the circuit board main body 811 via the non-conducting adhesive 8115.

More particularly, in an example of the present application, the conducting medium 8114 is implemented as a mixture of metal particles (when the diameter of the particles is smaller than a certain threshold, the metal particles is implemented as metal powder) and viscous substance, wherein the metal particles may be gold, silver, aluminum, copper, metal alloy, non-metal and metal alloy, etc., and the viscous substance may be thermo-curing glue and the like. In particular, the conducting medium 8114 has good electrical conductivity through special material selection and composition, and the conducting medium 8114 may be cured in a temperature range of 80-200° C. by adjusting the property of the viscous substance in the conducting medium 8114. Meanwhile, in an example of the present application, the non-conducting adhesive 8115 includes a resin material such as epoxy resin or polyimide resin, which will be cured in a temperature range of 80-200° C. Particularly, in an example of the present application, during the process of electrically connecting the electrical connecting plate 812 to the circuit board main body 811, the circuit board assembly 810 is heated to a specific temperature range, preferably, the specific temperature range is 80° C.-150° C.

It should be noted that, in an example of the present application, the conducting medium 8114 includes an adhesive with flexible characteristics, and the non-conducting adhesive 8115 also has good flexibility. From the perspective of overall performance, the integral connecting structure 8110 has a deformable property, which facilitates the electrical connecting plate 812 to synchronously realize the electrical connection and non-electrical connection between the electric connecting plate 812 and the circuit boards 811 in a manner of pressing the electric connecting plate 812 against the integral connecting structure 8110. In particular, in an example of the present application, the required pressing force is 0.5-5N. That is to say, in the present application, the electrical connection and the non-electrical connection between the electrical connecting plate 812 and the circuit board main body 811 may be realized simultaneously with a relatively small pressing force, and the process difficulty is lower; in addition, the low pressing force may also protect the electrical connecting plate 812 to avoid being deformed, broken, and other undesirable phenomena; while in the existing FC process, the pressing force is usually above 10N (usually is set to 30N), and the pressing force is relatively large, the photosensitive chip is at risk of being deformed or even broken.

It is worth mentioning that, in an example of the present application, during the process of electrically connecting and adhering the electrical connecting plate 812 to the circuit board main body 811 through the integral connecting structure 8110, the circuit board assembly 810 is heated to a relatively low temperature (at 80-150°). That is to say, in an example of the present application, the process of electrically connecting the electrical connecting plate 812 to the circuit board main body 811 is performed at a relatively low temperature, so that the difficulty of the process is reduced on one hand; and on the other hand, the amount of expansion and contraction of the non-conducting adhesive 8115 disposed between the electrical connecting plate 812 and the circuit board main body 811 is also reduced, thereby reducing the deformability of the non-conducting adhesive 8115 on the circuit board main body 811 and the electrical connecting plate 812, and improving the flatness of the circuit board main body 811 and the electrical connecting plate 812. Moreover, since the process of electrically connecting the electrical connecting plate 812 to the circuit board main body 811 is performed at a relatively low temperature, the self-expansion of the circuit board main body 811 will be relatively reduced, thereby facilitate to improve the surface flatness of the circuit board main body 811.

Figure 22A:
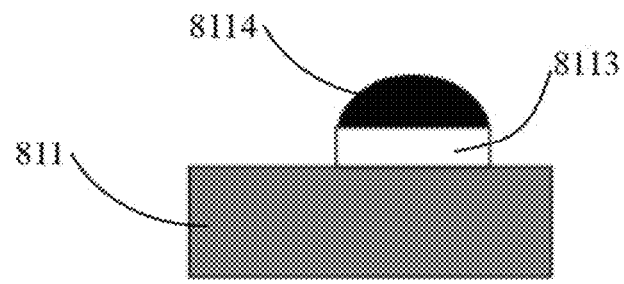
FIG. 22A is a schematic diagram illustrating a modified implementation of a conducting medium and a circuit board electrical connecting terminal according to an example of the present application.
Figure 22B:
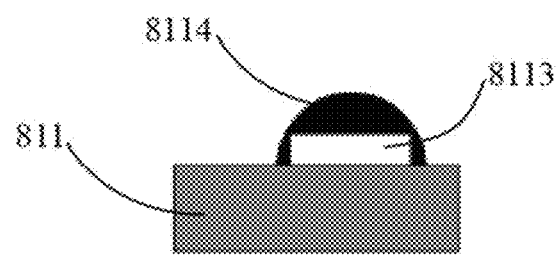
FIG. 22B is a schematic diagram illustrating another modified implementation of a conducting medium and a circuit board electrical connecting terminal according to an example of the present application.

Further, in an example of the present application, during the process of forming the integral connecting structure 8110, firstly the conducting medium 8114 is disposed on the circuit board electrical connecting terminal 8113 of the circuit board main body 811, wherein the conducting medium 8114 has a circular convex shape (the reason for having such a shape is the surface tension of the conducting medium 8114). In particular, in an example of the present application, the size of the conducting medium 8114 is smaller than that of the circuit board electrical connecting terminal 8113, and the conducting medium 8114 covers a part of the circuit board electrical connecting terminal 8113, such a configuration of size relationship may effectively control the conducting medium 8114 within the range of the circuit board electrical connecting terminal 8113, so as to prevent the conducting medium 8114 from overflowing to contaminate the structure of the circuit board main body 811, during the process of electrically connecting the electrical connecting plate 812 to the circuit board main body 811. Of course, in other examples of the present application, the size relationship between the conducting medium 8114 and the circuit board electrical connecting terminal 8113 may also be configured in other types, for example, the size of the conducting medium 8114 is equal to that of the circuit board electrical connecting terminal 8113, and the conducting medium 8114 completely covers the circuit board electrical connecting terminal 8113 (as shown in FIG. 22A); alternatively, the size of the conducting medium 8114 is larger than that of the circuit board electrical connecting terminal 8113, and the conducting medium 8114 covers the circuit board electrical connecting terminal 8113 therein (as shown in FIG. 22B); in this regard, it is not limited by this application. It is worth mentioning that, when the size of the conducting medium 8114 is equal to that of the circuit board electrical connecting terminal 8113, and the conducting medium 8114 completely covers the circuit board electrical connecting terminal 8113, the contact area between the conductive medium 8114 and the circuit board electrical connecting terminal 8113 may be increased, thereby improving the electrical conductivity. When the size of the conducting medium 8114 is larger than that of the circuit board electrical connecting terminal 8113, and the conducting medium 8114 covers the circuit board electrical connecting terminal 8113 therein, the contact area between the conducting medium 8114 and the circuit board electrical connecting terminal 8113 may be maximized, thereby further improving the electrical conductivity. However, it should be noted that, when the size of the conducting medium 8114 is larger than that of the circuit board electrical connecting terminal 8113, and the conducting medium 8114 covers the circuit board electrical connecting terminal 8113 therein, it is necessary to control the distance between each of the conducting mediums 8114 disposed on the different circuit board electrical connecting terminals 8113, thereby preventing the circuit from being short-circuit and failing.

In order to form the integral connecting structure 8110, the non-conducting adhesive 8115 is further applied on the conducting medium 8114, and preferably completely covers the conducting medium 8114 and the circuit board electrical connecting terminals 8113.

In particular, in an example of the present application, the conducting medium 8114 and the non-conducting adhesive 8115 have a layered structure, i.e., the conducting medium 8114 and the non-conducting adhesive 8115 are not mixed with each other. As mentioned above, in the existing ACF glue, the conductive particles are uniformly distributed in the adhesive (i.e., the conductive particles and the adhesive are mixed with each other); in addition, during the process of electrical connection between the hard board and the flexible board via ACF glue, the ACF glue is heated and pressurized to rupture the insulating film of the conductive particles to form conduction. However, during the process of heating and pressurizing, it is inevitable that a part of the insulating film of the conductive particles in the vertical direction (i.e., the Z-axis direction) is not crushed, thereby affecting the conductivity in the vertical direction, i.e., the process of electrical connection between the hard board and flexible board has characteristics of being random and uncontrollable. Correspondingly, in an example of the present application, the metal particles in the conducting medium 8114 are stacked, and the circuit board electrical connecting terminal 8113 of the circuit board main body 811 and the connecting plate electrical connecting terminal 8122 of the electric circuit board 812 are in contact with the metal particles in the conducting medium in both vertical and horizontal directions. In this way, the electrical conductivity between the circuit board main body 811 and the electrical connecting plate 812 is improved (especially conduction rate in the vertical direction).

In addition, under the action of temperature and pressure, in the prior art, the gaps of the upper and lower electrical connecting terminals are filled with fluidity by ACF, similarly the gaps of the upper and lower electrical connecting terminals are filled with fluidity by the conductive particles in the ACF. However, on one hand, it is probabilistic that the conductive particles may flow into the gap, and the accuracy is not very controllable; in the other hand, there are also conductive particles exist between the lateral electrical connecting terminals, excessive or large conductive particles may contact and connect with each other between adjacent lateral electrical connecting terminals during the pressing process, resulting in a short circuit of lateral conduction and abnormal electrical function. Correspondingly, in an example of the present application, the non-conducting adhesive 8115 in the integral connecting structure 8110 covers the circuit board electrical connecting terminal 8113 and the conducting medium 8114, so that two adjacent circuit board electrical connecting terminals 8113 are blocked by the non-conducting adhesive 8115, thereby preventing a short circuit between the two circuit board electrical connecting terminals 8113.

Figure 23:
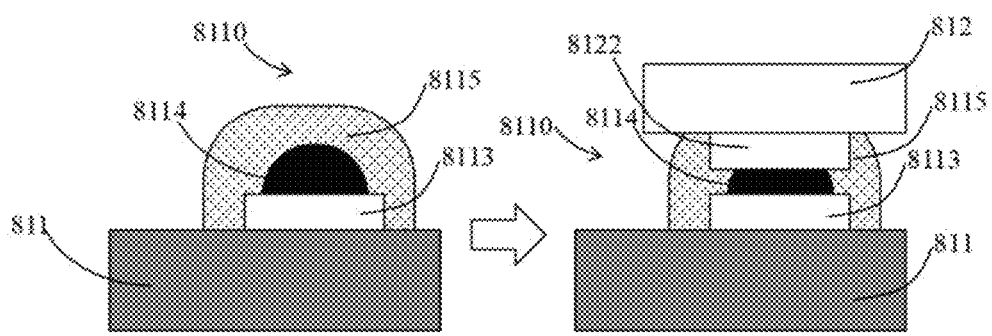
FIG. 23 is a schematic diagram illustrating a modified implementation of the circuit board assembly according to an example of the present application.

FIG. 23 is a schematic diagram illustrating a process of electrically connecting the electrical connecting plate 812 to the circuit board main body 811 according to an example of the present application. As shown in FIG. 23, during the process of electrically connecting the electrical connecting plate 812 to the circuit board main body 811 (the temperature of the process environment is raised to 80-150° C.), firstly the electrical connecting plate 812 is brought close to the circuit board main body 811, so that the connecting plate electrical connecting terminal 8122 of the electrical connecting plate 812 corresponds to the circuit board electrical connecting terminal 8113 of the circuit board main body 811; secondly the distance between the electrical connecting plate 812 and the circuit board main body 811 is slowly reduced (for example, pressing down the electrical connecting plate 812), so that the connecting plate electrical connecting terminal 8122 of the electrical connecting plate 812 passes through the non-conducting adhesive 8115 that is not fully cured to be in contact with the conducting medium 8114, so as to realize the electrical connection between the electrical connecting plate 812 and the circuit board main body 811, and the conducting medium 8114 has a certain adhesive property and may be used to fix the electrical connecting plate 812 thereon; then the distance between the electrical connecting plate 812 and the circuit board main body 811 is continuously shortened (for example, continuing to press down the electrical connecting plate 812), so that the connecting plate electrical connecting terminal 8122 of the electrical connecting plate 812 is pressed against the conducting medium 8114 to make the conducting medium 8114 deformed, thereby improving the stability of the electrical connection between the electrical connecting plate 812 and the circuit board main body 811. At the same time, under such a specific process ambient temperature, the non-conducting adhesive 8115 will also be gradually cured, so that during the process of electrically connecting the electrical connecting plate 812 to the circuit board main body 811, the electrical connecting plate 812 is also firmly attached to the circuit board main body 811 via the non-conducting adhesive 8115. In this way, on one hand the stability of the electrical connection between the electric connecting plate 812 and the circuit board main body 811 may be ensured, and on the other hand the bonding strength between the electrical connecting plate 812 and the circuit board main body 811 may also be effectively ensured. That is to say, in an example of the present application, the electrical connecting plate 812 is electrically connected to the circuit board main body 811, and the electrical connecting plate 812 is bonded to the circuit board main body 811 almost simultaneously, so that the physical bonding between the electrical connecting plate 812 and the circuit board main body 811 formed through the non-conducting adhesive 8115 may ensure the stability of the electrical connection between electrical connecting plate 812 and the circuit board main body 811.

Figure 24:
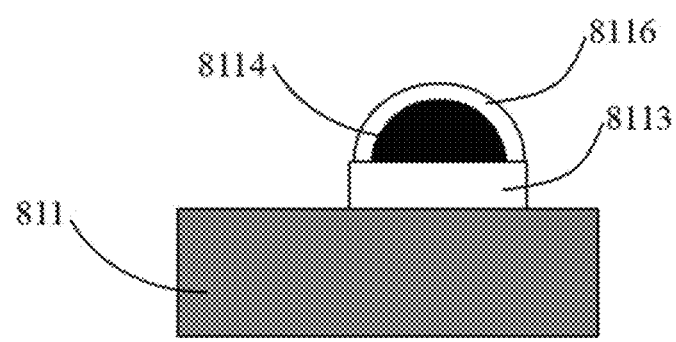
FIG. 24 is a schematic diagram illustrating another modified implementation of the circuit board assembly according to an example of the present application.
Figure 25:
FIG. 25 is a schematic diagram illustrating yet another modified implementation of the circuit board assembly according to an example of the present application.

In order to enhance the electrical conductivity between the connecting plate electrical connecting terminal 8122 of the electrical connecting plate 812 and the circuit board electrical connecting terminal 8113 of the circuit board main body 811, as shown in FIG. 24, in yet another modified example of the circuit board assembly 810 according to an example of the application, the conducting medium 8114 further includes a conductive film 8116 formed on the surface thereof. Preferably, the conductive film 8116 completely covers the outer surface of the conducting medium 8114. In a particular implementation, the conductive film 8116 may be formed on the surface of the conducting medium 8114 by chemical plating or electroplating, wherein the coating material may be selected from gold, silver, aluminum, copper, and the like.

Figure 26:
FIG. 26 is a schematic diagram illustrating yet another modified implementation of the circuit board assembly according to an example of the present application.
Figure 27:
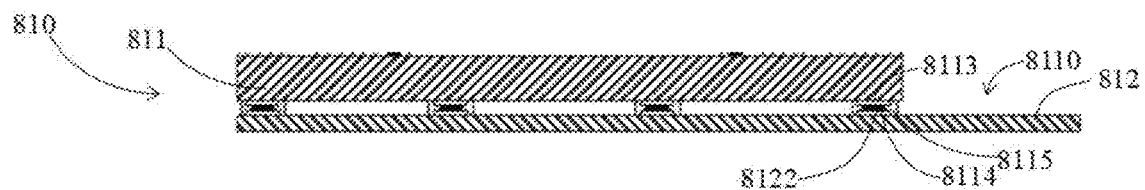
FIG. 27 is a schematic diagram illustrating yet another modified implementation of the circuit board assembly according to an example of the present application.
Figure 28:
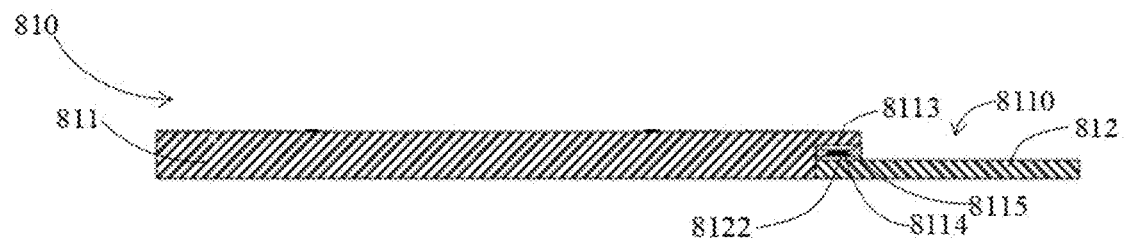
FIG. 28 is a schematic diagram illustrating yet another modified implementation of the circuit board assembly according to an example of the present application.

Further, as shown in FIG. 21, in an example of the present application, the circuit board electrical connecting terminal 8113 is formed on the upper surface of the circuit board main body 811, more particularly, formed on an edge area of the upper surface; the connecting plate electrical connecting terminal 8122 is formed on the lower surface of the electrical connecting plate 812, more particularly, formed on an edge area of the lower surface thereof. That is to say, in an example of the present application, the electrical connecting plate 812 is mounted and electrically connected to the upper surface of the circuit board main body 811. Of course, those skilled in the art should understand that, in an example of the present application, the bonding position between the electrical connecting plate 812 and the circuit board main body 811 may also be implemented in other types. For example, in the modified implementation of the circuit board assembly according to an example of the present application as illustrated in FIG. 8, the edge area of the upper surface of the circuit board main body 811 is recessed downward to form a concave part, and the electrical connecting plate 812 is mounted and electrically connected to the concave part of the circuit board main body 811. Preferably, the upper surface of the electrical connecting plate 812 is flush with the upper surface of the circuit board main body 811. For another example, in the modified implementation of the circuit board assembly according to an example of the present application as shown in FIGS. 26-28, the electrical connecting plate 812 is mounted and electrically connected to the lower surface of the circuit board main body 811. More particularly, in the modified implementation of the circuit board assembly as shown in FIG. 26, the circuit board electrical connecting terminal 8113 is formed on the edge area of the lower surface of the circuit board main body 811, and the connecting plate electrical connecting terminals 8122 is formed on the edge area of the upper surface of the electrical connecting plate 812. In a modified implementation of the circuit board assembly as illustrated in FIG. 27, the circuit board electrical connecting terminal 8113 is formed on the lower surface of the circuit board main body 811, and the connecting plate electrical connecting terminal 8122 is formed on the upper surface of the electrical connecting plate 812. In a modified implementation of the circuit board assembly shown in FIG. 28, the edge area of the lower surface of the circuit board main body 811 is recessed upward to form a concave part, and the electrical connecting plate 812 is mounted and electrically connected to the concave part of the circuit board main body 811, and preferably the lower surface of the electrical connecting plate 812 is flush with the lower surface of the circuit board main body 811.

In conclusion, the circuit board assembly 810 according to the examples of the present application has been illustrated, which has at least the following advantages.

Firstly, in an example of the present application, the electrical connection and the non-electrical connection between the circuit board main body 811 and the electrical connecting plate 812 is synchronously realized through the integral connecting structure 8110 composed of the conducting medium 8114 and the non-conducting adhesive 8115 which are disposed between the circuit board main body 811 and the electrical connecting plate 812. In this way, the stability of the electrical connection between the circuit board main body 811 and the electrical connecting plate 812 is improved.

Secondly, in an example of the present application, the conducting medium 8114 in the integral connecting structure 8110 is in contact with the circuit board main body 811 and the electrical connecting plate 812 in both vertical and horizontal directions, thereby improving the electrical conductivity (especially the conductivity in the vertical direction).

Thirdly, the pressing force required for pressing the electrical connecting plate 812 against the circuit board main body 811 is relatively small, about 0.5-5N. That is to say, in an example of the present application, the electrical connection and the non-electrical connection between the circuit board main body 811 and the electrical connecting plate 812 may be realized simultaneously with a small pressing force, and the process difficulty is lower.

Fourthly, in an example of the present application, during the process of electrically connecting and bonding the circuit board main body 811 to the electrical connecting plate 812 through the integral connecting structure 8110, the circuit board assembly 810 is heated to a relative low temperature (at 80-150°). That is to say, in an example of the present application, the process of electrically connecting the electrical connecting plate 812 to the circuit board main body 811 is performed at a relatively low temperature, so as to reduce the difficulty of the process on one hand; and on the other hand the amount of expansion and contraction of the non-conducting adhesive 8115 disposed between the circuit board main body 811 and the electrical connecting plate 812 is reduced, thereby reducing the deformability of the non-conducting adhesive 8115 to the circuit board main body 811, and improving the flatness of the circuit board main body 811.

Fifthly, in an example of the present application, since the process of electrically connecting the electrical connecting plate 812 to the circuit board main body 811 is performed at a relatively low temperature, the self-expansion of the circuit board main body 811 will be relatively reduced, thereby reducing the amount of bending of the circuit board main body 811.

In addition, in an example of the present application, the non-conducting adhesive 8115 in the integral connecting structure 8110 covers the circuit board electrical connecting terminal 8113 and the conducting medium 8114, so that two adjacent circuit board electrical connecting terminals 8113 are isolated by the non-conducting adhesive 8115, thereby preventing a short circuit between the two circuit board electrical connecting terminals 8113.

Although the integral connecting structure 8110 formed on the circuit board main body 811 is taken as an example and described above, those skilled in the art should know that in other examples of the present application, firstly the integral connecting structure 8110 may also be formed on the electrical connecting plate 812, i.e., the conducting medium 8114 is formed on the connecting plate electrical connecting terminal 8122, and the non-conducting adhesive 8115 is applied to the conducting medium 8114 to form the integral connecting structure 8110. Correspondingly, during the electrical connection process, the circuit board main body 811 is pressed against the integral connecting structure 8110 which is formed on the electrical connecting plate 812, so that the circuit board electrical connecting terminals 8113 is electrically connected to the connecting plate electrical connecting terminal 8122 via the conducting medium 8114, while the circuit board main body 811 is bonded to the electrical connecting plate 812 by the non-conducting adhesive 8115; in this regard, it is not limited by this application.

Also, although in the circuit board assembly 810 as shown in FIGS. 21-28, it is only illustrated that the circuit board assembly 810 includes the circuit board main body 811, the electrical connecting plate 812 and the electrical connecting terminal 813, a person of ordinary skill in the art should know that in an actual product, the circuit board assembly 810 further includes at least one electronic component (e.g., capacitor, inductor, resistor, etc.) disposed on the circuit board main body 811; in this regard, it is not limited by this application.

Figure 29:
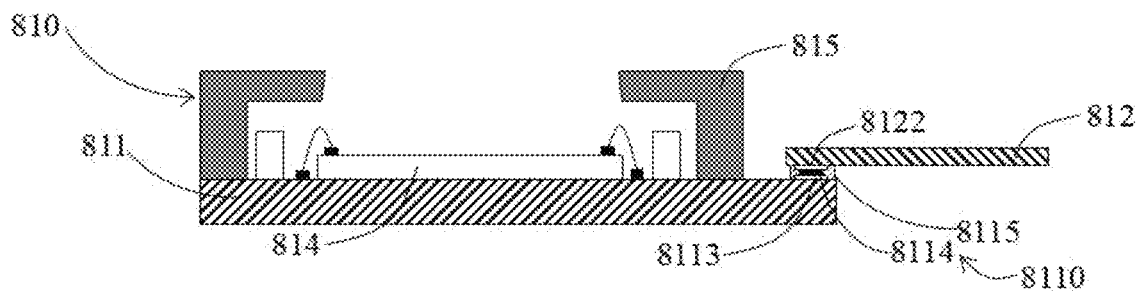
FIG. 29 is a schematic diagram illustrating a photosensitive assembly according to an example of the present application.
Figure 30:
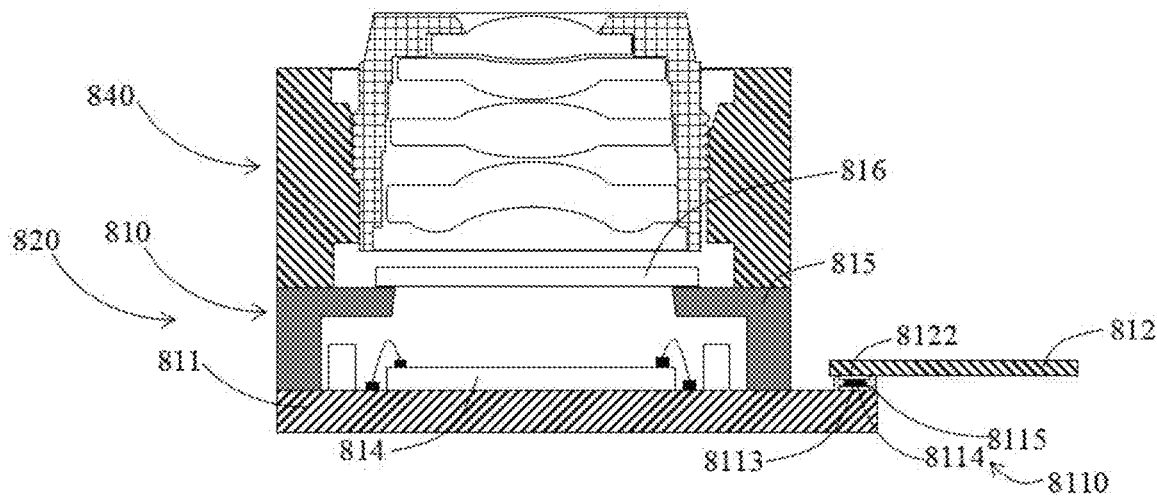
FIG. 30 is a schematic diagram illustrating a camera module according to an example of the present application.

Further, as shown in FIG. 29, the circuit board assembly 810 according to an example of the present application may cooperate with other components to form a photosensitive assembly 820, wherein the photosensitive assembly 820 includes the circuit board assembly 810 described above and a photosensitive chip 814 electrically connected to the circuit board main body 811, and other necessary components, such as a packaging body 815 formed on the circuit board main body 811, a filter element 816 supported on the photosensitive chip 814, etc., since it is not the focus of this application, it will not be repeated herein. Further, as shown in FIG. 30, the photosensitive assembly 820 may also cooperate with an optical lens 840 to form a camera module, wherein the optical lens 840 is maintained in the photosensitive path of the photosensitive assembly 820.

Exemplary Manufacturing Process of Circuit Board Assembly

Figure 31A:
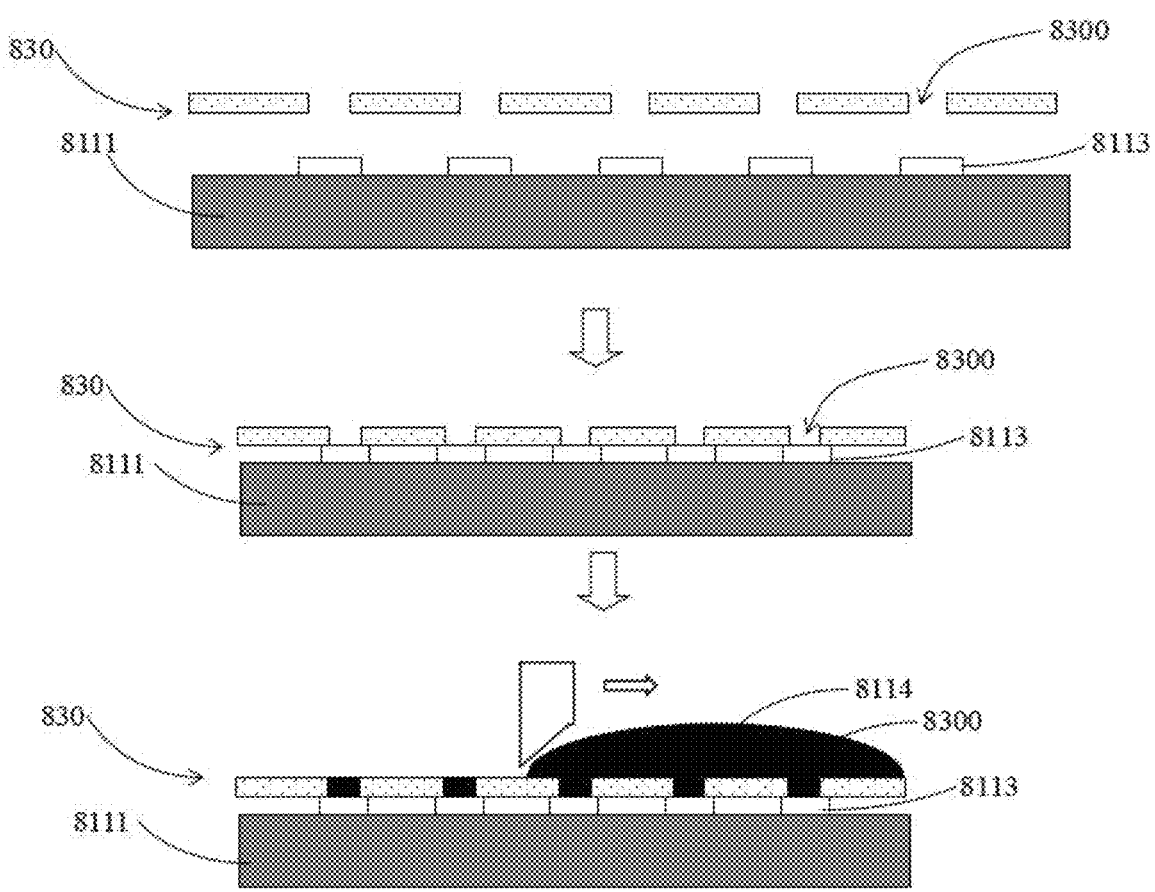
FIGS. 31A and 31B are schematic diagrams illustrating a first manufacturing process of the circuit board assembly according to an example of the present application.
Figure 31B:
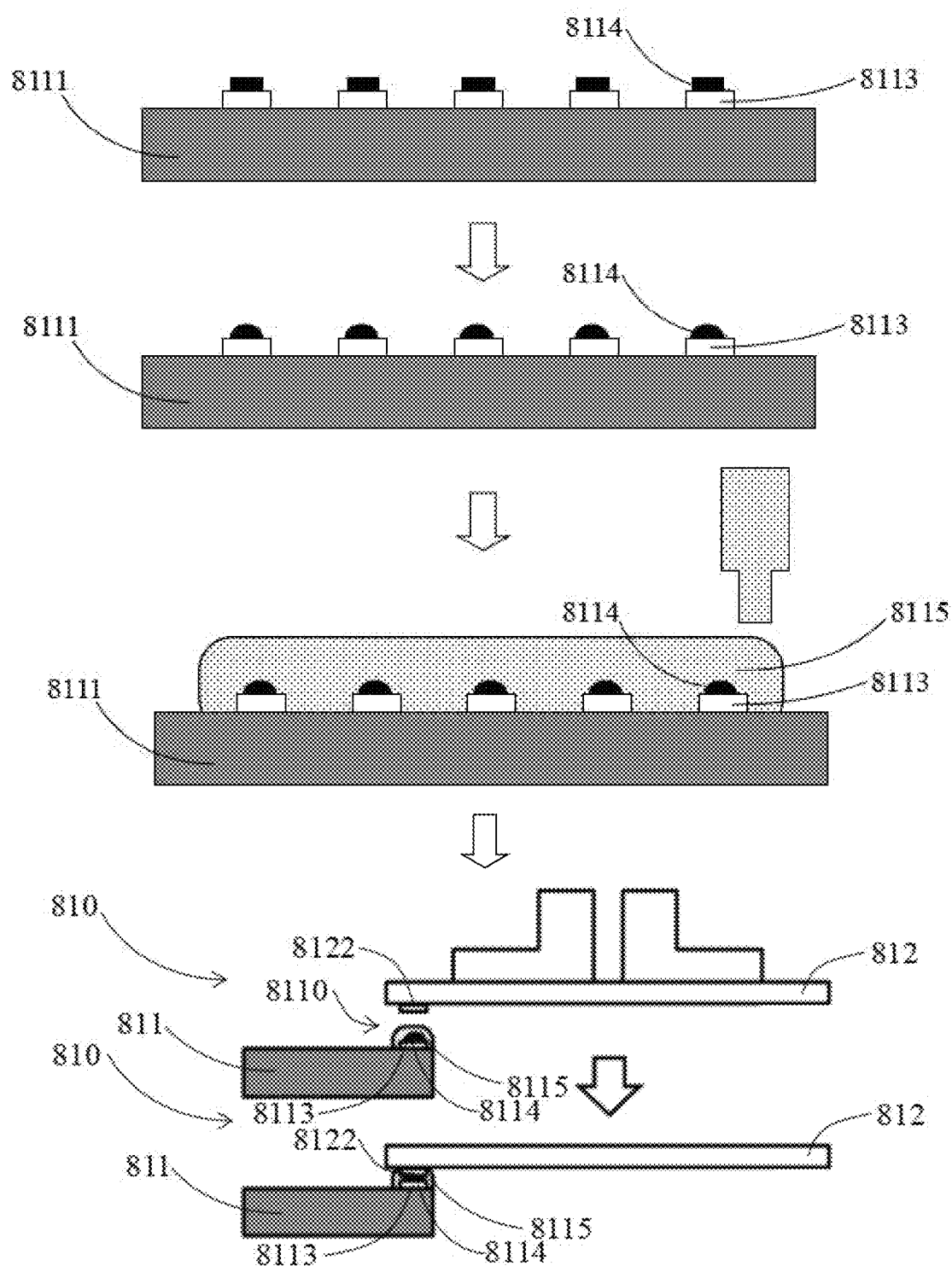

As shown in FIGS. 31A-31B, the first manufacturing process of the circuit board assembly according to an example of the present application is illustrated, wherein the manufacturing process as shown in FIGS. 31A-31B is taken as an example for manufacturing the circuit board assembly 810 as shown in FIG. 21.

Particularly, as shown in FIG. 31A, in the manufacturing process, firstly a circuit board main body 811 and an electrical connecting plate 812 are provided, wherein the circuit board main body 811 has circuit board electrical connecting terminals 8113 disposed on the surface thereof, and the electrical connecting plate 812 has connecting plate electrical connecting terminals 8122 disposed on the surface thereof.

Further, as shown in FIG. 31A, a conductive medium 8114 are formed on the circuit board electrical connecting terminals 8113 respectively.

Particularly, in this exemplary manufacturing process, forming a conducting medium 8114 on the circuit board electrical connecting terminals 8113, including:

Firstly, a layer of mask 830 or a printing plate is disposed on the upper surface of the circuit board main body 811, wherein the mask 830 has a series of openings 8300 passing through it and corresponding to the circuit board electrical connecting terminals 8113 respectively. Then, excess conducting medium 8114 is applied over the mask 830. Next, the redundant conducting medium 8114 on the surface of the mask 830 is removed. Then, the mask 830 is removed to form the conducting medium 8114 at positions corresponding to the openings 8300. In particular, in this exemplary manufacturing process, the size of the opening 8300 is smaller than that of the circuit board electrical connecting terminal 8113, so that the mask 830 is removed to form the conducting medium 8114 at the corresponding position of the opening 8300, wherein the conducting medium has the following properties: the size of the conducting medium 8114 is smaller than that of the circuit board electrical connecting terminal 8113, and the conducting medium 8114 covers a part of the circuit board electrical connecting terminal 8113. Of course, those skilled in the art should understand that, as for other modified implementations of the circuit board assembly 810 corresponding to the examples of the present application, in other manufacturing processes, the size of the opening 8300 of the mask 830 may correspond to that of the circuit board electrical connecting terminal 8113, so that the mask 830 is removed to form the conducting medium 8114 at the corresponding position of the opening 8300, wherein the conducting medium has the following properties: the size of the conducting medium 8114 is equal to that of the circuit board electrical connecting terminal 8113, and the conducting medium 8114 completely covers the circuit board electrical connecting terminal 8113. Alternatively, the size of the opening 8300 of the mask 830 may be larger than that of the circuit board electrical connecting terminal 8113, so that the mask 830 is removed to form the conducting medium 8114 at the corresponding position of the opening 8300, wherein the conducting medium has the following properties: the size of the conducting medium 8114 is larger than that of the circuit board electrical connecting terminal 8113, and the conducting medium 8114 covers the circuit board electrical connecting terminal 8113 therein.

It is worth mentioning that, after removing the mask 830 to form the conducting medium 8114 at the corresponding position of the opening 8300, the conducting medium 8114 will become a conductive round convex with a structure of small upper part and big lower part due to the effect of gravity, and its upper surface is a cambered surface. Further, the conducting medium 8114 may be pre-cured by heating, so as to be fixed on the circuit board electrical connecting terminal 8113.

Further, as shown in FIG. 31B, a non-conducting adhesive 8115 is applied on the conducting medium 8114.

Further, as shown in FIG. 31B, the connecting plate electrical connecting terminal 8122 is pressed against the conducting medium 8114 to electrically connect the connecting plate electrical connecting terminal 8122 and the circuit board electrical connecting terminal 8113, and the electrical connecting plate 812 is bonded to the lower surface of the circuit board main body 811 through the non-conducting adhesive 8115, and in this way the electrical connecting plate 812 is electrically connected to the circuit board main body 811. That is to say, in this example of the present application, the electrical connection and the non-electrical connection between the electrical connecting plate 812 and the circuit board main body 811 are realized through an integral connecting structure 8110 formed by the conducting medium 814 and the non-conducting adhesive 815 which are disposed between the circuit board main body 811 and the electrical connecting plate 812, thereby ensuring the stability of the electrical connection between the electrical connecting plate 812 and the circuit board main body 811, and reducing the process difficulty.

It is worth mentioning that, in an example of the present application, there is a special relationship between the properties of the conducting medium 8114 and the non-conducting adhesive 8115. Particularly, the conducting medium 8114 and the non-conducting adhesive 8115 are configured to have the following properties: during the process of electrically connecting the electrical connecting plate 812 to the circuit board main body 811, the circuit board assembly 810 is heated to a specific temperature range, wherein the conducting medium 8114 has deformable property in this specific temperature range, and at the same time, the non-conducting adhesive 8115 is cured in this specific temperature range. Correspondingly, during the process of pressing the connecting plate electrical connecting terminal 8122 against the conducting medium 8114 to electrically connect the connecting plate electrical connecting terminal 8122 and the circuit board electrical connecting terminal 8113, and bonding the electrical connecting plate 812 to the lower surface of the circuit board main body 811 via the non-conducting adhesive 8115, the electrical connecting plate 812 and the circuit board main body 811 are heated to 80-150° C.; in this temperature range, the conducting medium 8114 has deformable property, and at the same time the non-conducting adhesive 8115 is cured.

It should be understood that in an example of the present application, during the process of electrically connecting and bonding the electrical connecting plate 812 to the circuit board main body 811 through the integral connecting structure 8110, the circuit board assembly 810 is heated to a relatively low temperature (at 80-150°). That is to say, in an example of the present application, the process of electrically connecting the electrical connecting plate 812 to the circuit board main body 811 is performed at a relatively low temperature.

Particularly, during the process of pressing the connecting plate electrical connecting terminals 8122 against the conducting medium 8114 to electrically connect the connecting plate electrical connecting terminals 8122 and the circuit board electrical connecting terminals 8113, and bonding the electrical connecting plate 812 to the lower surface of the circuit board main body 811 via the non-conducting adhesive 8115, firstly the electrical connecting plate 812 is brought close to the circuit board main body 811, so that the connecting plate electrical connecting terminals 8122 of the electrical connecting plate 812 correspond to the circuit board electrical connecting terminals 8113 of the circuit board main body 811; secondly the distance between the electric connecting plate 812 and the circuit board main body 811 is gradually shortened (for example, pressing down the electrical connecting plate 812), so that the connecting plate electrical connecting terminals 8122 of the electrical connecting plate 812 pass through the non-conducting adhesive 8115 that is not fully cured to be in contact with the conducting medium 8114, thereby achieving the electrical connection between the electrical connecting plate 812 and the circuit board main body 811; then the distance between the electrical connecting plate 812 and the circuit board main body 811 is continuously shortened (for example, continuing to press down the electrical connecting plate 812), so that the connecting plate electrical connecting terminals 8122 of the electrical connecting plate 812 is pressed against the conducting medium 8114 to make the conducting medium 8114 deformed, thereby improving the stability of the electrical connection between the electrical connecting plate 812 and the circuit board main body 811. At the same time, under this specific process environment temperature, the non-conducting adhesive 8115 will be gradually cured, so that during the process of electrically connecting the electrical connecting plate 812 to the upper surface of the circuit board main body 811, the electrical connecting plate 812 is also firmly attached to the upper surface of the circuit board main body 811 via the non-conducting adhesive 8115. In this way, the stability of electrical connection between the electrical connecting plate 812 and the circuit board main body 811 may be ensured on one hand, and on the other hand the bonding strength between the electrical connecting plate 812 and the circuit board main body 811 may also be effectively ensured. That is to say, in an example of the present application, electrically connecting the electrical connecting plate 812 to the upper surface of the circuit board main body 811, and bonding the electrical connecting plate 812 to the upper surface of the circuit board main body 811 are performed almost simultaneously, so that the physical bonding between the electrical connecting plate 812 and the circuit board main body 811 formed by the non-conducting adhesive 8115 may ensure the stability of the electrical connection between the electrical connecting plate 812 and the circuit board main body 811.

In particular, in an example of the present application, the required pressing force is 0.5-5N. That is to say, in the present application, the electrical connection and the non-electrical connection between the electrical connecting plate 812 and the circuit board main body 811 may be realized simultaneously with a relatively small pressing force, and the process difficulty is lower; in addition, the low pressing force may also protect the electrical connecting plate 812 to avoid being deformed, broken and other undesirable phenomena; while in the existing FC process, the pressing force is usually above 10N (usually is set to 30N), and the pressing force is relatively large, so that the photosensitive chip is at risk of being deformed or even broken.

It is worth mentioning that, in order to enhance the electrical conductivity between the electrical connecting plate 812 and the circuit board main body 811, in other manufacturing processes of the present application, a conductive film 8116 may also be formed on the surface of the conducting medium 8114, for example, by chemical plating or electroplating.

To sum up, the first manufacturing process of the circuit board assembly 810 according to the examples of the present application has been illustrated, by which the circuit board assembly 810 and its modified examples may be prepared as described above.

Figure 32A:
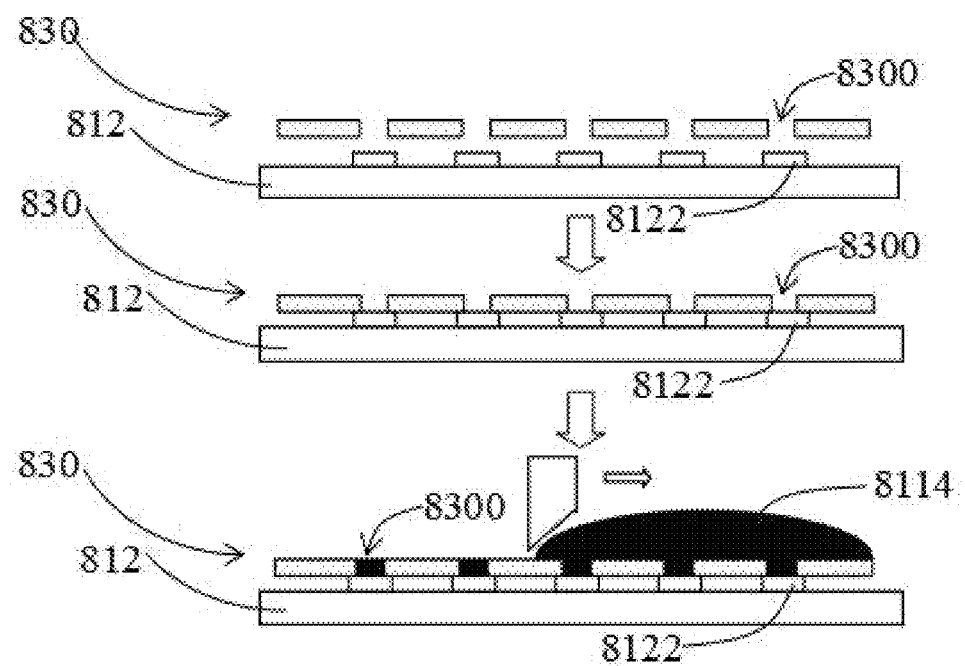
FIGS. 32A and 32B are schematic diagrams illustrating a second manufacturing process of the circuit board assembly according to an example of the present application.
Figure 32B:
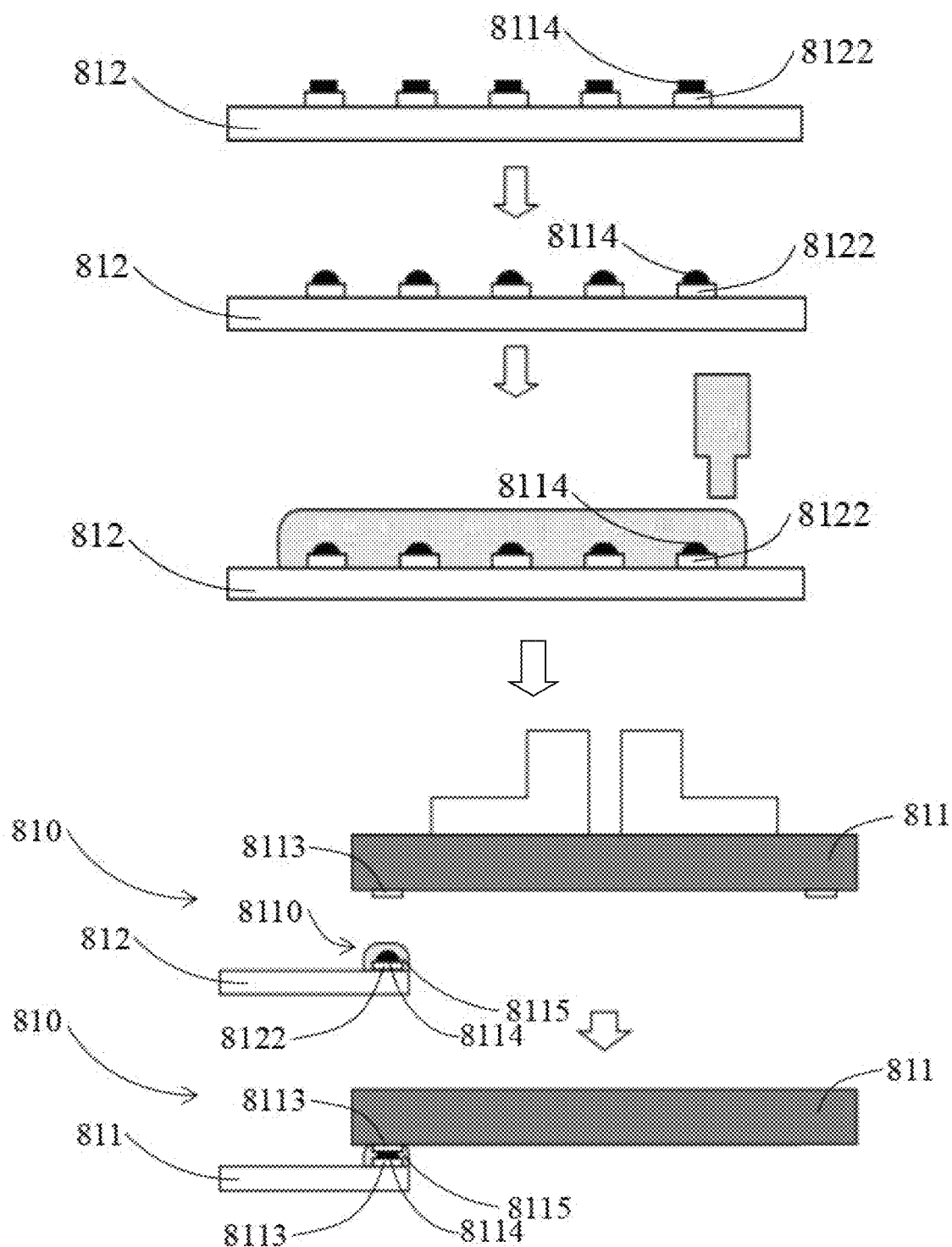

As shown in FIG. 32A and FIG. 32B, the second manufacturing process of the circuit board assembly according to an example of the present application is illustrated, wherein the manufacturing process as shown in FIG. 32A and FIG. 32B is taken as an example for manufacturing the circuit board assembly 810 as shown in FIG. 21.

Particularly, as shown in FIG. 32A, in this manufacturing process, firstly a circuit board main body 811 and an electrical connecting plate 812 are provided, wherein the circuit board main body 811 has circuit board electrical connecting terminals 8113 disposed on the surface thereof, and the electrical connecting plate 812 has connecting plate electrical connecting terminals 8122 disposed on the surface thereof.

Further, as shown in FIG. 32A, a conductive medium 8114 are formed on the connecting plate electrical connecting terminals 8122 respectively.

Particularly, in this exemplary manufacturing process, forming a conducting medium 8114 on the connecting plate electrical connecting terminals 8122, including:

Firstly, a layer of mask 830 or a printing plate is disposed on the lower surface of the electrical connecting plate 812, wherein the mask 830 has a series of openings 8300 passing through it and corresponding to the connecting plate electrical connecting terminals 8122 respectively. Then, excess conducting medium 8114 is applied over the mask 830. Next, the redundant conducting medium 8114 on the surface of the mask 830 is removed. Then, the mask 830 is removed to form the conducting medium 8114 at positions corresponding to the openings 8300. In particular, in this exemplary manufacturing process, the size of the opening 8300 is smaller than that of the connecting plate electrical connecting terminal 8122, so that the mask 830 is removed to form the conducting medium at the corresponding position of the opening 8300, wherein the conducting medium 8114 has the following properties: the size of the conducting medium 8114 is smaller than that of the connecting plate electrical connecting terminal 8122, and the conducting medium 8114 covers a part of the connecting plate electrical connecting terminal 8122. Of course, those skilled in the art should understand that, as for other modified implementations of the circuit board assembly 810 corresponding to the examples of the present application, and in other manufacturing processes, the size of the opening 8300 of the mask 830 may correspond to that of the connecting plate electrical connecting terminal 8122, so that the mask 830 is removed to form the conducting medium 8114 at the corresponding position of the opening 8300, wherein the conducting medium 8114 has the following properties: the size of the conducting medium 8114 is equal to that of the connecting plate electrical connecting terminal 8122, and the conducting medium 8114 completely covers the connecting plate electrical connecting terminal 8122. Alternatively, the size of the opening 8300 of the mask 830 may be larger than that of the connecting plate electrical connecting terminal 8122, so that the mask 830 is removed to form the conducting medium 8114 at the corresponding position of the opening 8300, wherein the conducting medium 8114 has the following properties: the size of the conducting medium 8114 is larger than that of the connecting plate electrical connecting terminal 8122, and the conducting medium 8114 covers the connecting plate electrical connecting terminal 8122 therein.

It is worth mentioning that, after removing the mask 830 to form the conducting medium 8114 at the corresponding position of the opening 8300, the conducting medium 8114 will become a conductive round convex with a structure of small upper part and big lower part due to the effect of gravity, and its upper surface is a cambered surface. Further, the conducting medium 8114 may be pre-cured by heating, so as to be fixed on the connecting plate electrical connecting terminals 8122.

Further, as shown in FIG. 32B, a non-conducting adhesive 8115 is applied on the conducting medium 8114.

Further, as shown in FIG. 32B, the circuit board electrical connecting terminals 8113 are pressed against the conducting medium 8114 to electrically connect the circuit board electrical connecting terminals 8113 to the connecting plate electrical connecting terminals 8122, and the circuit board main body 811 is bonded to the lower surface of the electrical connecting plate 812 through the non-conducting adhesive 8115, and in this way the electrical connecting plate 812 is electrically connected to the circuit board main body 811. That is to say, in an example of the present application, the electrical connection and non-electrical connection between the electrical connecting plate 812 and the circuit board main body 811 are realized through an integral connecting structure 8110 formed by the conducting medium 814 and the non-conducting adhesive 815 which are disposed between the circuit board main body 811 and the electrical connecting plate 812, thereby ensuring the stability of electrical connection between the electrical connecting plate 812 and the circuit board main body 811, and reducing the process difficulty.

It is worth mentioning that, in an example of the present application, there is a special relationship between the properties of the conducting medium 8114 and the non-conducting adhesive 8115. Particularly, the conducting medium 8114 and the non-conducting adhesive 8115 are configured to have the following properties: during the process of electrically connecting the electrical connecting plate 812 to the circuit board main body 811, the circuit board assembly 810 is heated to a specific temperature range, wherein the conducting medium 8114 has deformable property in this specific temperature range, and at the same time the non-conducting adhesive 8115 is cured in this specific temperature range. Correspondingly, during the process of pressing the connecting plate electrical connecting terminals 8122 against the conducting medium 8114 to electrically connect the connecting plate electrical connecting terminals 8122 to the circuit board electrical connecting terminals 8113, and bonding the electrical connecting plate 812 to the lower surface of the circuit board main body 811 via the non-conducting adhesive 8115, the electrical connecting plate 812 and the circuit board main body 811 are heated to 80-150° C.; in this temperature range, the conducting medium 8114 has deformable property, and at the same time the non-conducting adhesive 8115 will be cured.

It should be understood that, in an example of the present application, during the process of electrically connecting and bonding the circuit board main body 811 to the electrical connecting plate 812 through the integral connecting structure 8110, the circuit board assembly 810 is heated to a relatively low temperature (at 80-150°). That is to say, in an example of the present application, the process of electrically connecting the circuit board main body 811 to the electrical connecting plate 812 is performed at a relatively low temperature.

Particularly, during the process of pressing the circuit board electrical connecting terminals 8113 against the conducting medium 8114 to electrically connect the circuit board electrical connecting terminals 8113 to the connecting plate electrical connecting terminals 8122, and bond the circuit board main body 811 to the lower surface of the electrical connecting plate 812 via the non-conducting adhesive 8115, firstly the circuit board main body 811 is brought close to the electrical connecting plate 812, so that the circuit board electrical connecting terminals 8113 of the circuit board main body correspond to the connecting plate electrical connecting terminals 8122 of the electrical connecting plate 812; secondly the distance between the electrical connecting plate 812 and the circuit board main body 811 is gradually shortened (for example, pressing down the electrical connecting plate 812), so that the circuit board electrical connecting terminals 8113 of the circuit board main body 811 pass through the non-conducting adhesive 8115 that is not fully cured to be in contact with the conducting medium 8114, thereby realizing the electrical connection between the electrical connecting plate 812 and the circuit board main body 811; then the distance between the electrical connecting plate 812 and the circuit board main body 811 is continuously shorten (for example, continuing to press down the electrical connecting plate 812), so that the circuit board electrical connecting terminals 8113 of the circuit board main body 811 is pressed against the conducting medium 8114 to make the conducting medium 8114 deformed, thereby improving the stability of the electrical connection between the electrical connecting plate 812 and the circuit board main body 811. At the same time, under this specific process environment temperature, the non-conducting adhesive 8115 will also be gradually cured, so that during the process of electrically connecting the circuit board main body 811 to the lower surface of the electrical connecting plate 812, the circuit board main body 811 is also firmly attached to the lower surface of the electrical connecting plate 812 via the non-conducting adhesive 8115. In this way, the stability of the electrical connection between the electrical connecting plate 812 and the circuit board main body 811 may be ensured on one hand, and on the other hand the bonding strength between the electrical connecting plate 812 and the circuit board main body 811 may also be effectively ensured. That is to say, in an example of the present application, electrically connecting the circuit board main body 811 to the lower surface of the electrical connecting plate 812, and bonding the circuit board main body 811 to the lower surface of the electrical connecting plate 812 are performed almost simultaneously, so that the stability of the electrical connection between the electrical connecting plate 812 and the circuit board main body 811 may be ensured through the physical bonding between the electrical connecting plate 812 and the circuit board main body 811 formed by the non-conducting adhesive 8115.

In particular, in an example of the present application, the required pressing force is 0.5-5N. That is to say, in the present application, the electrical connection and the non-electrical connection between the electrical connecting plate 812 and the circuit board main body 811 may be realized simultaneously with a relatively small pressing force, and the process is less difficult; in addition, the low pressing force may also protect the electrical connecting plate 812 from being deformed, broken and other undesirable phenomena; while in the existing FC process, the pressing force is usually above 10N (usually set to 30N), and the pressing force is relatively large, so that the photosensitive chip is at risk of being deformed or even broken.

It is worth mentioning that, in order to enhance the electrical conductivity between the electrical connecting plate 812 and the circuit board main body 811, in other manufacturing processes of the present application, a conductive film 8116 may also be formed on the surface of the conducting medium 8114, for example, by chemical coating or electroplating.

To sum up, the second manufacturing process of the circuit board assembly 810 according to an example of the present application has been illustrated, by which the circuit board assembly 810 and its modified examples may be prepared as described above.

It is worth mentioning that those of ordinary skill in the art should understand that, although the manufacturing of the circuit board assembly 810 shown in FIG. 21 is taken as an example in this application, however, on the basis of description of the drawings and the text descriptions of the modified implementations of the circuit board assembly 810 according to the present application, it should be possible to infer the manufacturing process of other implementations of the circuit board assembly 810 according to the examples of the present application, which will not be repeated herein.

It should be understood by those skilled in the art that, the examples of the present invention shown in the above description and the accompanying drawings are only examples and do not limit the present invention. The objects of the present invention have been fully and effectively achieved. The functional and structural principles of the present invention have been shown and described in the examples, and the examples of the present invention may be modified or amended in any way without departing from the principles.

The invention claimed is:

1. A photosensitive assembly, characterized by comprising:
   a circuit board, which includes a circuit board main body, a through hole formed through the circuit board main body, a set of circuit board electrical connecting terminals disposed on a lower surface of the circuit board main body, a conducting medium disposed on the circuit board electrical connecting terminals, and a non-conducting adhesive covering the conducting medium and the circuit board electrical connecting terminals; and
   a photosensitive chip, wherein an upper surface of the photosensitive chip includes a photosensitive area, a non-photosensitive area located around the photosensitive area, and chip electrical connecting terminals disposed in the non-photosensitive area;
   wherein the chip electrical connecting terminals of the photosensitive chip correspond to the circuit board electrical connecting terminals, and the chip electrical connecting terminals are in contact with the conducting medium to be electrically connected to the circuit board electrical connecting terminals, and the photosensitive chip is bonded to the lower surface of the circuit board via the non-conducting adhesive, so that the photosensitive chip is electrically connected to the circuit board;
   wherein the photosensitive area of the photosensitive chip corresponds to the through hole, so that external light reach the photosensitive area via the through hole;
   wherein the chip electrical connecting terminals are pressed against the conducting medium to be electrically connected to the circuit board electrical connecting terminals; and
   during the process of electrically connecting the photosensitive chip to the circuit board, the photosensitive assembly is heated to a specific temperature range, and the conducting medium has deformable property within the specific temperature range, and the non-conducting adhesive is cured in the specific temperature range.

2. The photosensitive assembly according to claim 1, wherein the specific temperature range is 80°-150°.

3. The photosensitive assembly according to claim 1, wherein the conducting medium is a mixture of metal particles and viscous substances.

4. The photosensitive assembly according to claim 3, wherein the conducting medium has a circular convex shape.

5. The photosensitive assembly according to claim 4, wherein a size of the conducting medium is smaller than that of the circuit board electrical connecting terminal and the conducting medium covers a part of the circuit board electrical connecting terminal, or a size of the conducting medium is equal to that of the circuit board electrical connecting terminal and the conducting medium completely covers the circuit board electrical connecting terminal, or a size of the conducting medium is larger than that of the circuit board electrical connecting terminal and the conducting medium covers the circuit board electrical connecting terminal therein.

6. The photosensitive assembly according to claim 1, wherein the conducting medium further includes a conductive film formed on the surface thereof.

7. The photosensitive assembly according to claim 1, wherein the lower surface of the circuit board located around the through hole is recessed upward to form a groove communicating with the through hole, and the circuit board electrical connecting terminal is disposed within the groove.

8. The photosensitive assembly according to claim 7, wherein the photosensitive chip is mounted in a receiving cavity defined by the groove and the through hole, and a bottom surface of the photosensitive chip is flush with the lower surface of the circuit board or protrudes from the lower surface of the circuit board or is lower than the lower surface of the circuit board.

9. The photosensitive assembly according to claim 8, further including a reinforcing plate disposed on the lower surface of the circuit board.

10. The photosensitive assembly according to claim 1, further including at least one electronic component disposed on an upper surface of the circuit board, or the lower surface of the circuit board, or both of the upper surface and the lower surface of the circuit board.

11. The photosensitive assembly according to claim 10, further including a packaging body which is integrally formed on the lower surface of the circuit board and embeds at least a part of the lower surface of the circuit board, the photosensitive chip, and at least a part of at least one electronic component disposed on the lower surface of the circuit board.

12. The photosensitive assembly according to claim 11, further including a filter element which is disposed on the upper surface of the circuit board and corresponds to the through hole.

13. The photosensitive assembly according to claim 11, further including a flexible board connecting plate which is electrically connected to the circuit board and an electrical connector which is electrically connected to the flexible board connecting plate.

14. The photosensitive assembly according to claim 13, wherein the flexible board connecting plate is integrally combined with the circuit board or mounted on and electrically connected to the upper surface of the circuit board or mounted on and electrically connected to the lower surface of the circuit board.

15. The photosensitive assembly according to claim 10, further including a shielding case which is disposed on the lower surface of the circuit board and covers the photosensitive chip therein.

16. The photosensitive assembly according to claim 15, further including a packaging body which is integrally formed on the lower surface of the circuit board and embeds at least a part of the lower surface of the circuit board, the shielding case, and at least a part of at least one electronic component disposed on the lower surface of the circuit board.

17. The photosensitive assembly according to claim 15, further including a packaging body which is mounted on the lower surface of the circuit board and covers at least a part of the lower surface of the circuit board, the shielding case, and at least a part of at least one electronic component disposed on the lower surface of the circuit board.

18. A camera module, characterized by comprising:
   the photosensitive assembly according to claim 1; and
   an optical lens, which is maintained on a photosensitive path of the photosensitive assembly.

* * * * *